US006503774B2

United States Patent
Tsai

(10) Patent No.: US 6,503,774 B2
(45) Date of Patent: Jan. 7, 2003

(54) EMBEDDING PARASITIC MODEL FOR PI-FET LAYOUTS

(75) Inventor: Roger S. Tsai, Torrance, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/840,562

(22) Filed: Apr. 23, 2001

(65) Prior Publication Data

US 2002/0073387 A1 Jun. 13, 2002

Related U.S. Application Data

(60) Provisional application No. 60/200,810, filed on Apr. 28, 2000, provisional application No. 60/200,307, filed on Apr. 28, 2000, provisional application No. 60/200,248, filed on Apr. 28, 2000, provisional application No. 60/200,290, filed on Apr. 28, 2000, provisional application No. 60/200,666, filed on Apr. 28, 2000, provisional application No. 60/200,622, filed on Apr. 28, 2000, and provisional application No. 60/200,302, filed on Apr. 28, 2000.

(51) Int. Cl.$^7$ .............................................. H01L 21/00
(52) U.S. Cl. ...................................................... 438/39
(58) Field of Search ..................... 438/14, 15; 333/103; 330/277; 257/409, 339; 331/117

(56) References Cited

U.S. PATENT DOCUMENTS 5,025,296 A * 6/1991 Fullerton .................... 357/23.8

OTHER PUBLICATIONS

Stanley Wolf, "Silicon Processing for the VLSI Era, vol. 3—The Submicron MOSFET"; 1995 ISBN 0–961672–5–3, pp. 350–356.*

* cited by examiner

Primary Examiner—John F. Niebling
Assistant Examiner—Andre' C Stevenson
(74) Attorney, Agent, or Firm—Katten Muchin Zavis Rosenman

(57) ABSTRACT

A model for a semiconductor device and more particularly to a Pi-FET with multiple gate fingers. The model takes into account various parasitics and the inter-relationship therebetween. In particular, multi-finger Pi-FETs are modeled as multiple single finger unit cells. Each single unit cell takes into account off-mesa parasitics, inter-electrode parasitics, on-mesa parasitics and includes an intrinsic model which represents the physics that predominantly determine FET performance. As such, the model can be used for relativity accurate device technology modeling, optimization of device performance and device design.

7 Claims, 39 Drawing Sheets

Model Construction
1) Off-Mesa, or Boundary Parasitic Model
2) Inter-electrode Parasitic Model
3) On-Mesa Parasitic Model
4) Intrinsic Model Implementation of the fifth level of embedding Frequency 0.05 to 40.05 GHz

EMBEDDING PARASITIC MODEL FOR PI-FET LAYOUTS

CROSS-REFERENCE TO RELATED APPLICATIONS

This application is a continuation of and claims priority of U.S. patent application Ser. No. 60/200,810 filed Apr. 28, 2000.

This application is related to the following commonly-owned co-pending patent application, Ser. No. 09/680,339, filed on Oct. 5, 2000: METHOD FOR UNIQUE DETERMINATION OF FET EQUIVALENT CIRCUIT MODEL PARAMETERS, by Roger Tsai. This application is also related to the following commonly-owned co-pending patent applications all filed on Apr. 28, 2000, S-PARAMETER MICROSCOPY FOR SEMICONDUCTOR DEVICES, by Roger Tsai, Ser. No. 60/200,307, SEMI-PHYSICAL MODELING OF HEMT DC-TO-HIGH FREQUENCY ELECTROTHERMAL CHARACTERISTICS, by Roger Tsai, Ser. No. 60/200,248, SEMI-PHYSICAL MODELING OF HEMT HIGH FREQUENCY NOISE EQUIVALENT CIRCUIT MODELS, by Roger Tsai, Ser. No. 60/200,290, SEMI-PHYSICAL MODELING OF HEMT HIGH FREQUENCY SMALL SIGNAL EQUIVALENT CIRCUIT MODELS, by Roger Tsai, Ser. No. 60/200,666, HYBRID SEMI-PHYSICAL AND DATA FITTING HEMT MODELING APPROACH FOR LARGE SIGNAL AND NON-LINEAR MICROWAVE/MILLIMETER WAVE CIRCUIT CAD, by Roger Tsai and Yao Chen, Ser. No. 60/200,622, and $PM^2$: PROCESS PERTURBATION TO MEASURED MODELED METHOD FOR SEMICONDUCTOR DEVICE TECHNOLOGY MODELING, by Roger Tsai, Ser. No. 60/200,302,

BACKGROUND OF THE INVENTION

1. Field of the Invention

The present invention relates to a method for modeling a semiconductor device and more particularly to a method for modeling a Pi-FET by embedding equivalent circuit models for a single-fingered device all within capacitive, inductive and resistive parasitic elements associated with the semiconductor device, interconnects and the inter-relationships therebetween.

2. Description of the Prior Art

The capability to accurately forecast product yield of semiconductor devices, such as microwave monolithic integrated circuits (MMIC), is an invaluable asset in manufacturing. Yield forecasting allows for better allocation of limited manufacturing resources; identification of yield problems; and reduced manufacturing costs. In GaAs MMIC manufacturing, the drive to new markets under reduced design costs and reduced time-to-market cycles have increased the probability for RF yield problems. These risks become even more acute when RF performance specifications are pushed to the limits of the process in accordance with the current trend in an ever more competitive environment.

Addressing the cause of poor MMIC yield can be an insidious problem in that it may not be specific. In particular, RF yield problems may occur as a result of unrealized shortcomings distributed across the entire manufacturing process. The principle mechanisms which contribute to yield loss in an MMIC manufacturing process are illustrated in FIG. 1. As shown, four out of seven possible mechanisms relate strongly to RF yield loss. Factors, such as unrealistic performance specification; poor design-for-manufacturing; and process variability may individually or accumulatively reduce the RF yield, thus raising the long term manufacturing costs as well as the design to manufacturing cycle time.

Various methods are used for RF yield forecasting. For example, both statistical and empirical modeling methods are known. Statistical modeling employs device models and circuit simulation while empirical modeling uses measured data. Such statistical models include Monte Carlo statistical models, correlated statistical models, boundary models and database models. Monte Carlo statistical models allow device model parameters to vary independently of each other by Gausian statistics while correlated statistical models are known to represent more realistic statistics in which the variations are constrained with correlation between the model parameters. Long-term model databases are typically created for the purpose of process control monitoring but can also be used in yield forecasting, for example, as disclosed in "A Product Engineering Exercise in 6-Sigma Manufacturability: Redesign of pHEMT Wideband LNA, by M. King et al., 1999 *GaAs MANTECH Technical Digest*, pp. 91–94, April 1999.

Boundary models are a set of models that represent the "process corner performance". Boundary models are known to be ideal for quickly evaluating the robustness of a new design to an anticipated process variation. Some manufacturers are known to develop methods that directly evaluate robustness through "process corner experimentation", for example as disclosed "GaAs Fabs Approach to Design-for-Manufacturability", by R. Garcia, et al. 1999 *GaAs MANTECH Technical Digest*, pp. 99–102, April 1999. However, the boundary methods cannot be used to determine RF performance distributions that are fundamental to yield calculation. As such, this method is unsuitable for RF yield prediction.

Long-term model databases are a powerful tool for MMIC process control monitoring and typically consist of large samples of small signal equivalent circuit model extractions for single consistent device structures, measured under a standard set of bias conditions. Database models unambiguously capture true process variations through uniform sampling. Unfortunately, such models are limited to applications based closely around original measurements. For example, accurately extending a database model to represent a device with different bias conditions and layouts is problematic. Such determinations are labor intensive, as generally set forth in; "A Product Engineering Exercise in 6-Sigma Manufacturability: Redesign of a pHEMT Wide-Band LNA," supra. In other circumstances, it is virtually impossible or unadvisable to apply database results, for example, to predict low noise or low signal results from a small signal model.

Monte Carlo statistics are simple to implement for RF yield simulations. However, forecasts produced by this method are relatively inaccurate and are normally used for worse case yield analysis. In particular, examples of inaccurate yield forecasts provided by Monte Carlo and correlated statistical models are shown in FIGS. 2A and 2B, which illustrate simulated versus actual noise and gain statistics for a 22–26 GHz GaAs pHEMT LNA. As illustrated, the squares and circles represent simulated data points by correlated statistical and Monte Carlo statistical models, respectively and the dashed line represents the measured data points.

Correlated statistical models provide a better method yet inaccurate correlated statistic models provide a better method, however, the results from this method can also be inaccurate. Another drawback of correlated statistical models is that substantial model databases are also needed in order derive the correlation which subject method to restrictions that normally plague long-term model databases.

As mentioned above, empirical forecasting is known to be used for forecasting RF yield. In such empirical forecasting methods, the long-term RF yield of one circuit is predicted by known process dependent RF yield characteristics of another circuit. This method can be thought of yield mapping which utilizes a linear mapping transformation between a critical RF performance parameter and the measured device process control monitor (PCM) data. This transform is known to be used to map PCM data into circuit performance space. Any distribution of PCM parameters are transformed into a distribution of RF performance. An example of such a transformation is shown in FIG. 3 which illustrates a transformation of a device PCM to MMIC RF performance space. To apply the yield map design to other circuits, an offset is included to account for differences associated with design. Such empirical methods are known to provide accurate forecasting of noise figure and small signal gain performance but not for power. An exemplary comparison of forecasted and measured noise figure performance for a 35 GHz GaAs pHEMT LNA is shown in FIG. 4 in which the forecasted data is shown with a line and measured data is shown by squares.

One drawback to yield mapping is that it cannot be used to accurately predict RF performance before the designs are produced. Instead its prediction must be refined as the design dependent offset becomes determined through feedback from the pre-production run.

Other empirical methods are known for forecasting RF yield parameter extraction using measured S-parameters. In such methods, the semiconductor device is modeled and parameters are extracted from the measured S-parameters using analytical techniques, for example, as disclosed in "A Semianalytical Parameter Extraction of a SPICE BSIM 3v3 for RF MOSFET's using S-Parameters", by Lee, et al., *IEEE Transactions on Microwave Theory and Techniques*, Vol. 48, No. 3, March 2000, pp. 4–416. Unfortunately, such a technique does not provide sufficiently accurate results to accurately forecast RF yield.

Unfortunately, to accurately model the characteristics of a semiconductor device, phenomenon associated with the internal structure of the device, such as, the length of the linear conductance region; the magnitude of saturating electrical fields; the effective transit distance for saturated carriers; and the like need to be considered. Finite element device simulations have been known to be used to calculate the internal electrical charge/electrical field structure of devices. Unfortunately, such device simulations are generally not accurate, thus providing results that are significantly different from measured device statistics. As such, there is a lack of analytical techniques that can resolve and measure electrical properties associated with the internal structure of a semiconductor device.

SUMMARY OF THE INVENTION

Briefly, the present invention relates to a model for a semiconductor device and more particularly to a Pi-FET with multiple gate fingers. The model takes into account various parasitics and the inter-relationship therebetween. In particular, multi-finger Pi-FETs are modeled as multiple single finger unit cells. Each single unit cell takes into account off-mesa parasitics, inter-electrode parasitics, on-mesa parasitics and includes an intrinsic model which represents the physics that predominantly determine FET performance. As such, the model can be used for relativity accurate device technology modeling, optimization of device performance and device design.

DESCRIPTION OF THE DRAWINGS

These and other advantages of the present invention will be readily understood with reference to the following specification and attached drawings wherein.

Figure 1:
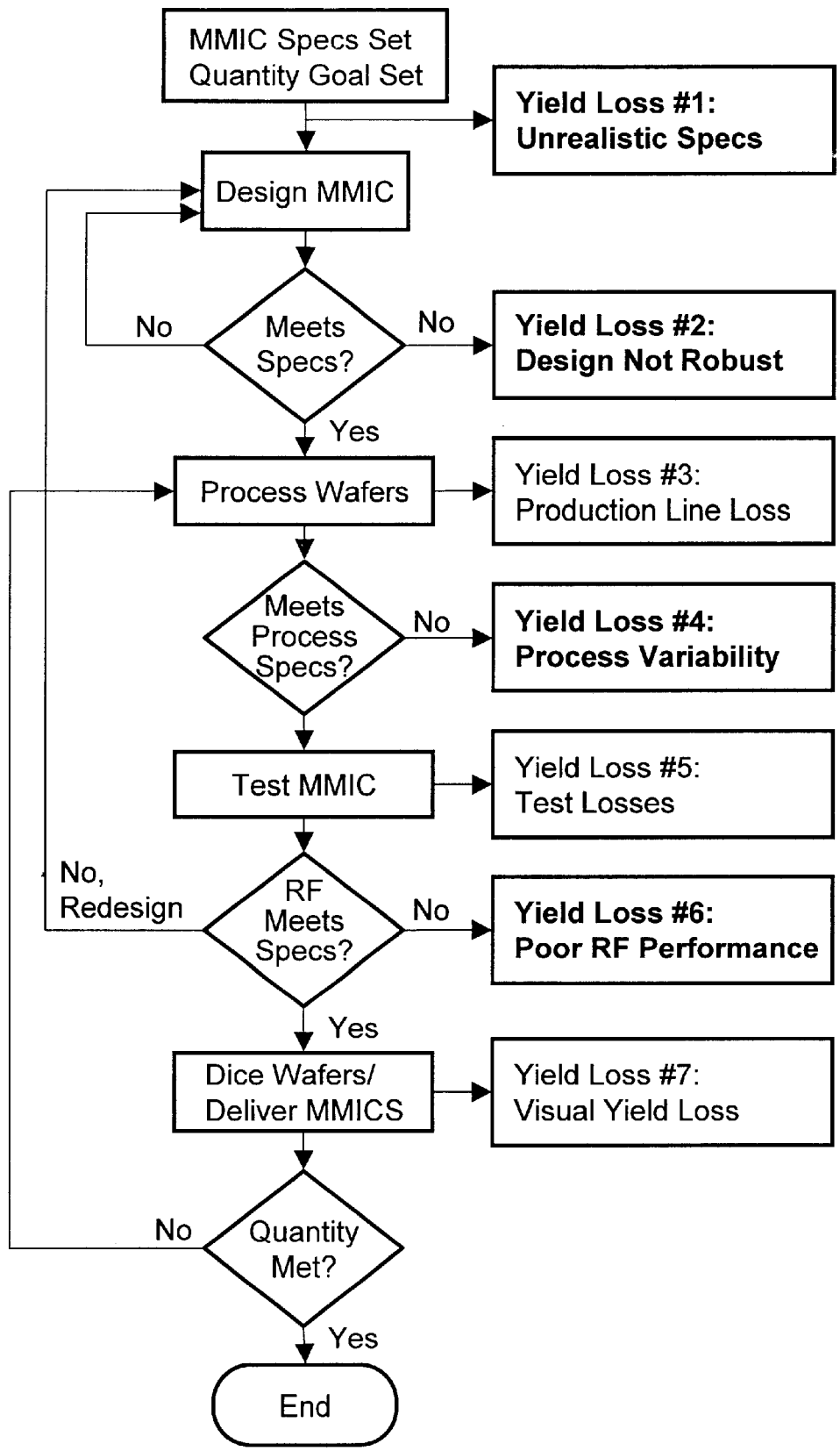
FIG. 1 is a flow chart of MMIC yield loss mechanisms known in the manufacturing process.
Figure 2A:
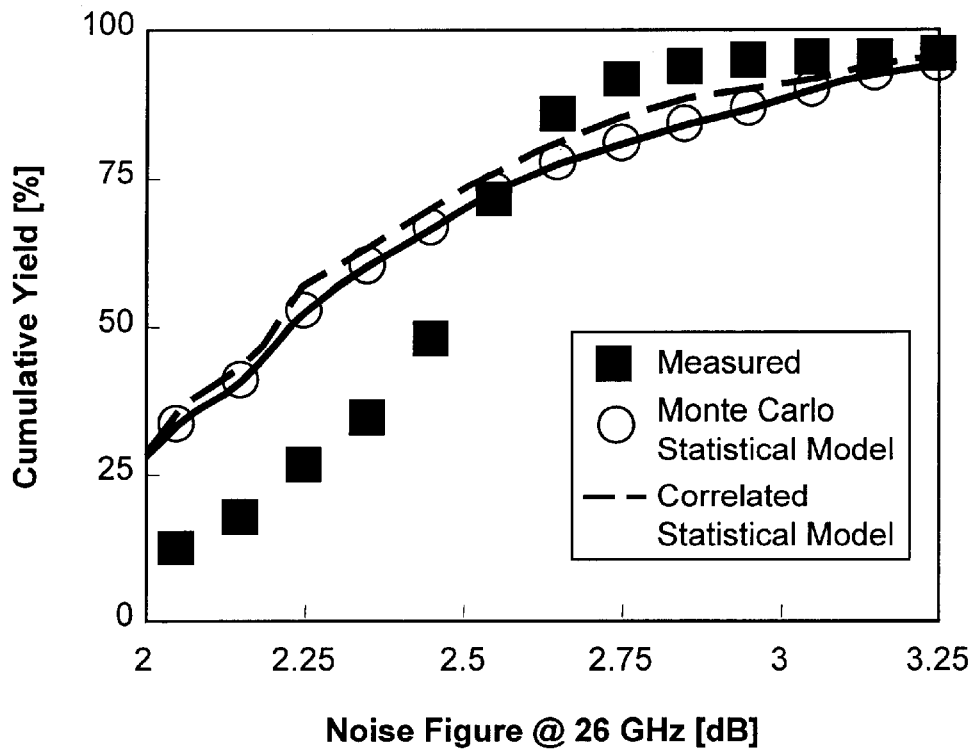
FIGS. 2A and 2B represent simulated versus cumulative yield for noise factor and gain, respectively, for a 26 GHz MMIC using Monte Carlo and correlated statistical device models, wherein the measured data is shown with squares; the Monte Carlo statistical data is shown with circles; and the measured data shown is with a dashed line.
Figure 2B:
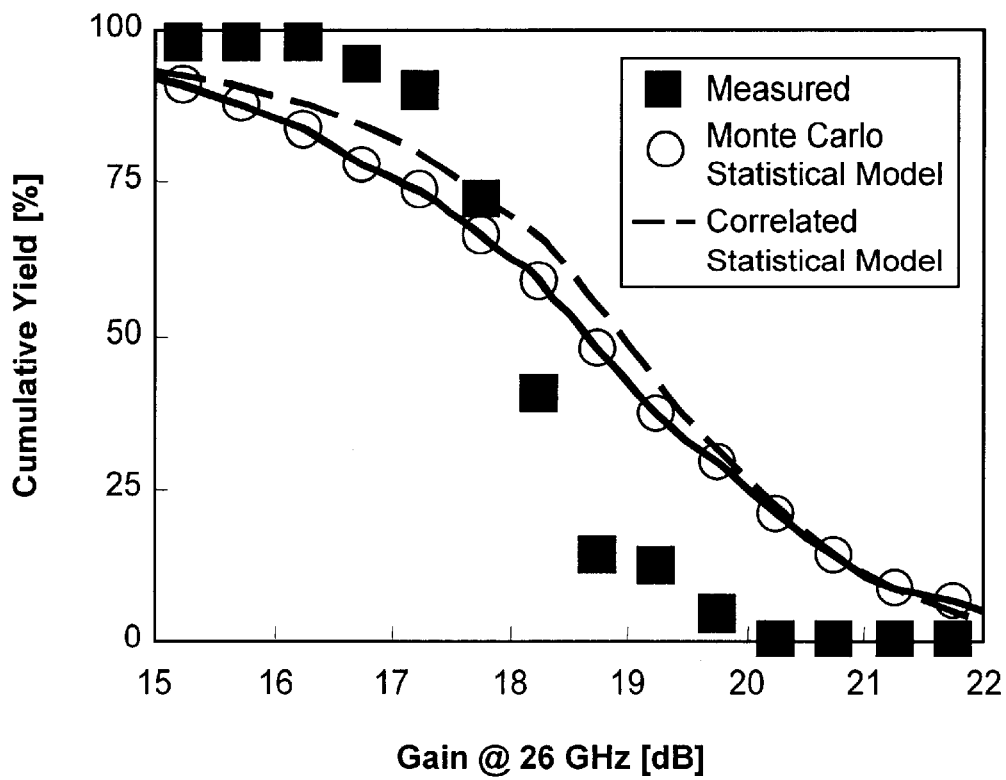

44B is a graphical illustrations of the magnitude as a function of an angle for S-parameter S21 for the final model solution from frequency 0.05 to 40 GHz.

DETAILED DESCRIPTION

The present invention relates to an equivalent circuit model for multi-fingered Pi-FETS that may be used with S-parameter microscopy (SPM) to enable qualitative investigation of the magnitude and location of electric charge and field distribution within the structure of a semiconductor device.

The Pi-FET model is discussed below in connection with FIGS. 20–38 and the SPM is discussed in connection with FIGS. 5–19. An extraction algorithms for extracting model parameters is discussed in connection with FIGS. 39–44. The SPM method utilizes bias dependent S-parameter measurements as a form of microscopy to provide qualitative analysis of the internal charge and electrical field structure of the semiconductor device heretofore unknown. Pseudo images are gathered in the form of S-parameter measurements extracted as small signal models to form charge control maps. Although finite element device simulations have heretofore been used to calculate the internal charge/electric field of semiconductor devices, such methods are known to be relatively inaccurate. In accordance with the present invention, the S-parameter microscopy provides a relatively accurate method for determining the internal charge and electric field within a semiconductor device. With accurate modeling of the internal charge and electric field, all of the external electrical characteristics of the semiconductor devices can be relatively accurately modeled including its high frequency performance. Thus, the system is suitable for making device technology models that enable high frequency MMIC yield analysis forecasting and design for manufacturing analysis.

S-parameter microscopy is similar to other microscopy techniques in that SPM utilizes measurements of energy reflected to and from a sample to derive information. More particularly, SPM is based on transmitted and reflective microwave and millimeter wave electromagnetic power or S-parameters. As such, S-parameter microscopy is analogous to the combined operation of scanning and transmission electron microscopes (SEM and TEM). Scattered RF energy is analogous to the reflection and transmission of the electron beams in the SEM and TEMs. However, instead of using electron detectors as in the SEM and TEMs, reflectometers in a network analyzer are used in S-parameter microscopy to measure a signal. S-parameter microscopy is similar to other microscopy techniques in that both utilize; measurement of scattering phenomenon as data; include mechanisms to focus measurements for better resolution; and include mechanisms to contrast portions of the measurement to discriminate detail as shown in Table 1 below:

TABLE 1

| General Microscopes | S-Parameter Microscope |
|---|---|
| Measure of scattered energy | Measures S-Parameters |
| Mechanism for "focus" | Focuses by extraction of <u>Unique</u> equivalent circuit models |
| Mechanism for "contrast" | Contrasts by using bias dependence to finely discriminate the nature and location of charge/electric fields |

RESULT: Detailed "images" of device's internal charge and electric field structure.

Images as discussed herein, in connection with S-parameter microscopy, do not relate to real images, but are used provide insight and qualitative detail regarding the internal operation of a device. More specifically, S-parameter microscopy does not provide visual images as in the case of traditional forms of microscopy. Rather, S-parameter microscopy images are more like maps which are computed and based on a non-intuitive set of measurements.

Figure 5:
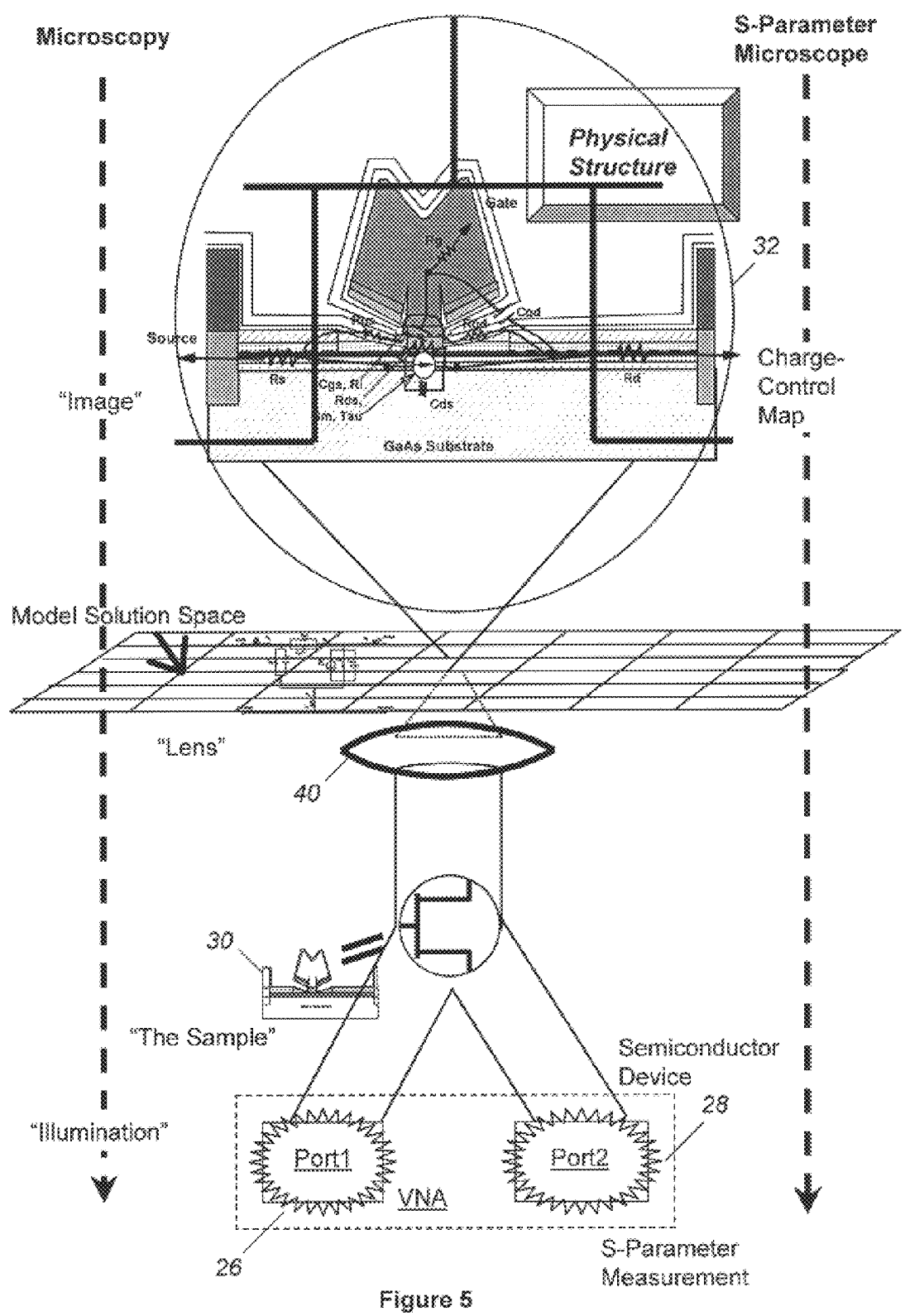
FIG. 5 represents an exemplary S-parameter microscope in accordance with the present invention.
Figure 6:
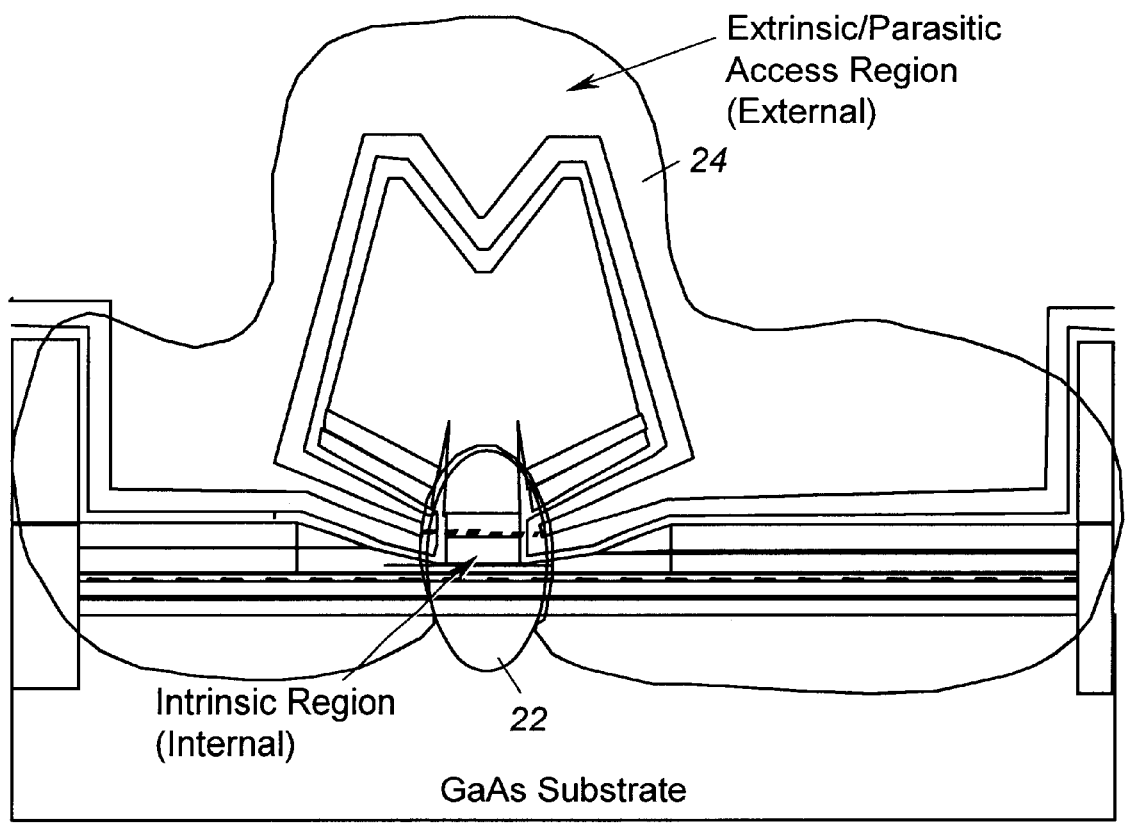
FIG. 6 illustrates the internal and external regions of an exemplary HEMT device.

FIG. 5 illustrates a conceptual representation of an S-parameter microscope, generally identified with the reference numeral 20. The S-parameter microscope 20 is analogous to a microscope which combines the principles of SEM and TEM. Whereas SEM measures reflections and TEM measures transmissions, the 2-port S-parameter microscope 20 measures both reflective and transmitted power. As a result, data derived from the 2-port S-parameter microscope contains information about the intrinsic and extrinsic charge structure of a device. More particularly, as in known in the art, SEM provides relatively detailed images of the surface of a sample through reflected electrons while TEM provides images of the internal structure through transmitted electrons. The reflective signals are used to form the external details of a sample while transmitted electrons provide information about the interior structure of a device. In accordance with an important aspect of the invention, S-parameter microscopy utilizes a process of measuring reflective and transmitted signals to provide similar "images" of the charge structure of a semiconductor device. As used herein the internal and external electrical structure of a semiconductor device are commonly referred to as intrinsic device region and 22 and extrinsic parasitic access region 24 as shown in FIG. 6. Also contributing to the external electrical structure of the device are parasitic components associated with its electrode and interconnects, which are not shown. These are the so-called "layout parasitics".

Figure 7:
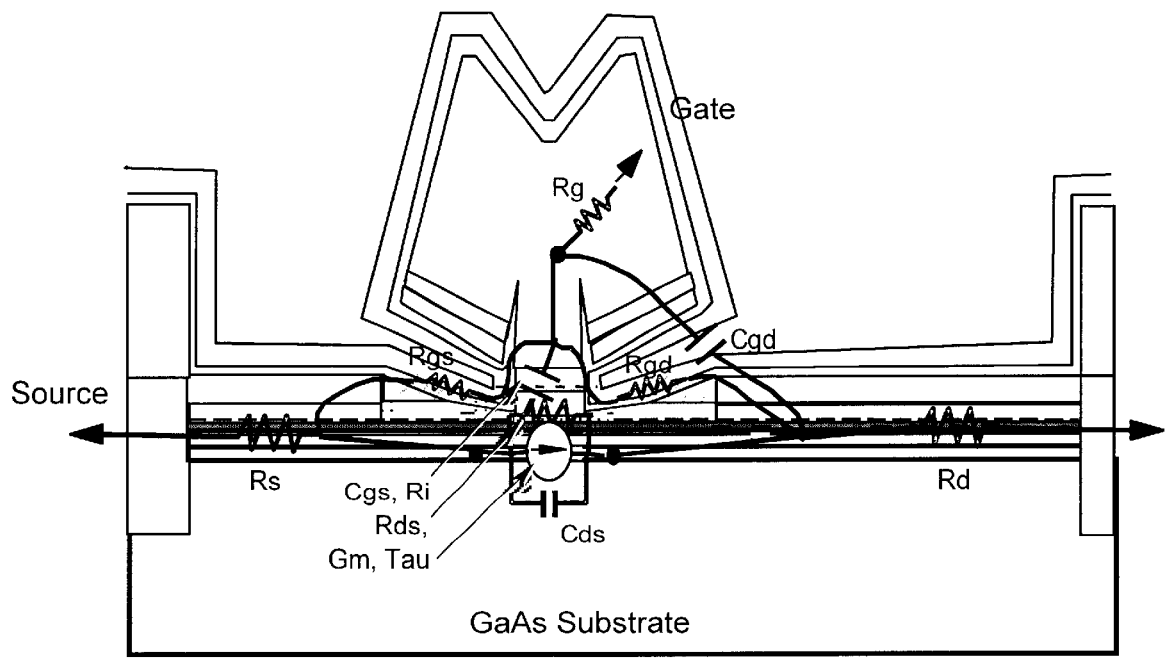
FIG. 7 is similar to FIG. 5 but illustrates the approximate locations of the model elements in the HEMT FET device illustrated is FIG. 5.

Referring to FIG. 5, the ports 26 and 28 are emulated by S-parameter measurements. The S-parameter measurements for a specific semiconductor device, generally identified with the reference number 30, are processed in accordance with the present invention to provide charge control maps, shown within the circle 32, analogous to images in other microscopy techniques. These charge control maps 32, as will be discussed in more detail below, are expressed in the form of equivalent circuit models. As shown in FIG. 7, linear circuit elements are used in the models to represent the magnitude and state of charge/electric fields inside the semiconductor device 30 or its so-called internal electrical structure. The position of the circuit elements within the model topology is roughly approximate the physical location within the device structure, hence the charge control map represents a diagram of the device's internal electrical structure.

Figure 8:
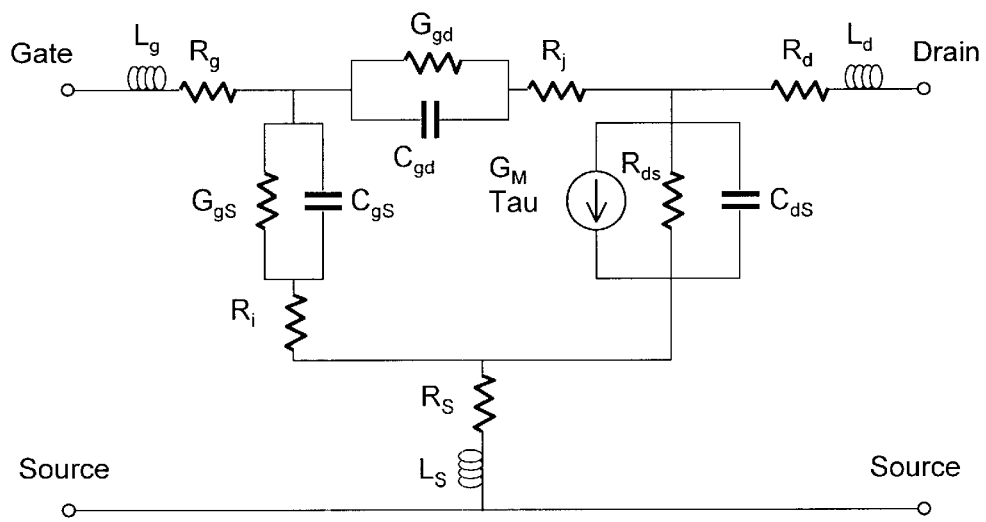
FIG. 8 is a schematic diagram of a common source FET equivalent circuit model.
Figure 9:
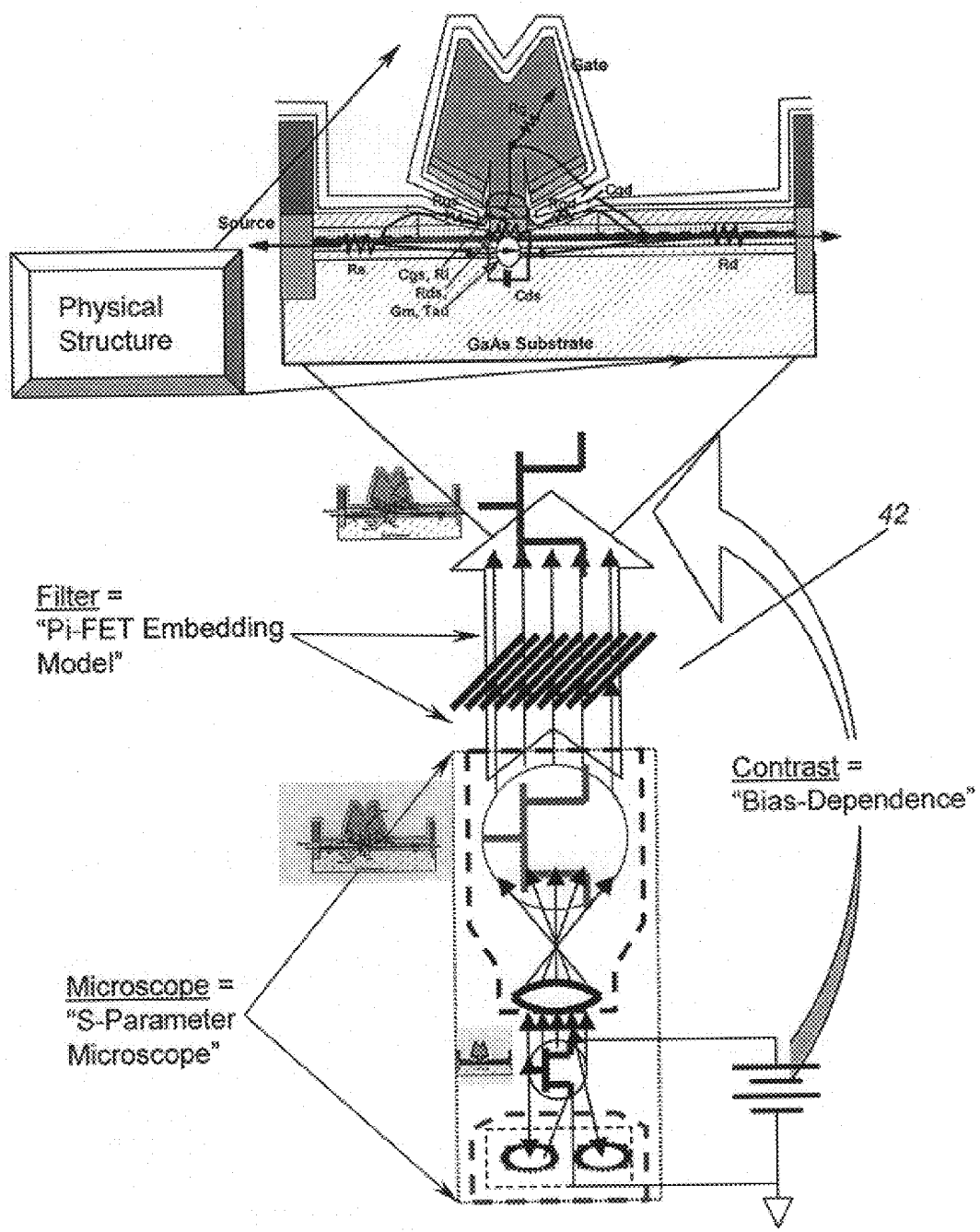
FIG. 9 is an illustration of specific application of the S-parameter microscope illustrated in FIG. 5.

The interpretation of the exact location of measured charge/electric fields within the semiconductor device is known to be ambiguous since an equivalent circuit model, for example, as illustrated in FIG. 8 with discrete linear elements, is used to represent the distributed structure of the charge/electric fields in the actual device. Although there is no exact method for distinguishing the physical boundaries between measured quantities, bias dependence is used to clarify how the S-parameters should be discriminated, separated and contrasted. In particular, changing bias conditions is known to change the magnitude and shift boundaries between the charge and electric fields within the device. The changes are normally predictable and qualitatively well known in most technologies. As such, the charge control maps can readily be used as maps illustrating the characterization of physical changes in magnitude, location and separation of electrical charge and electric fields.

Figure 10:
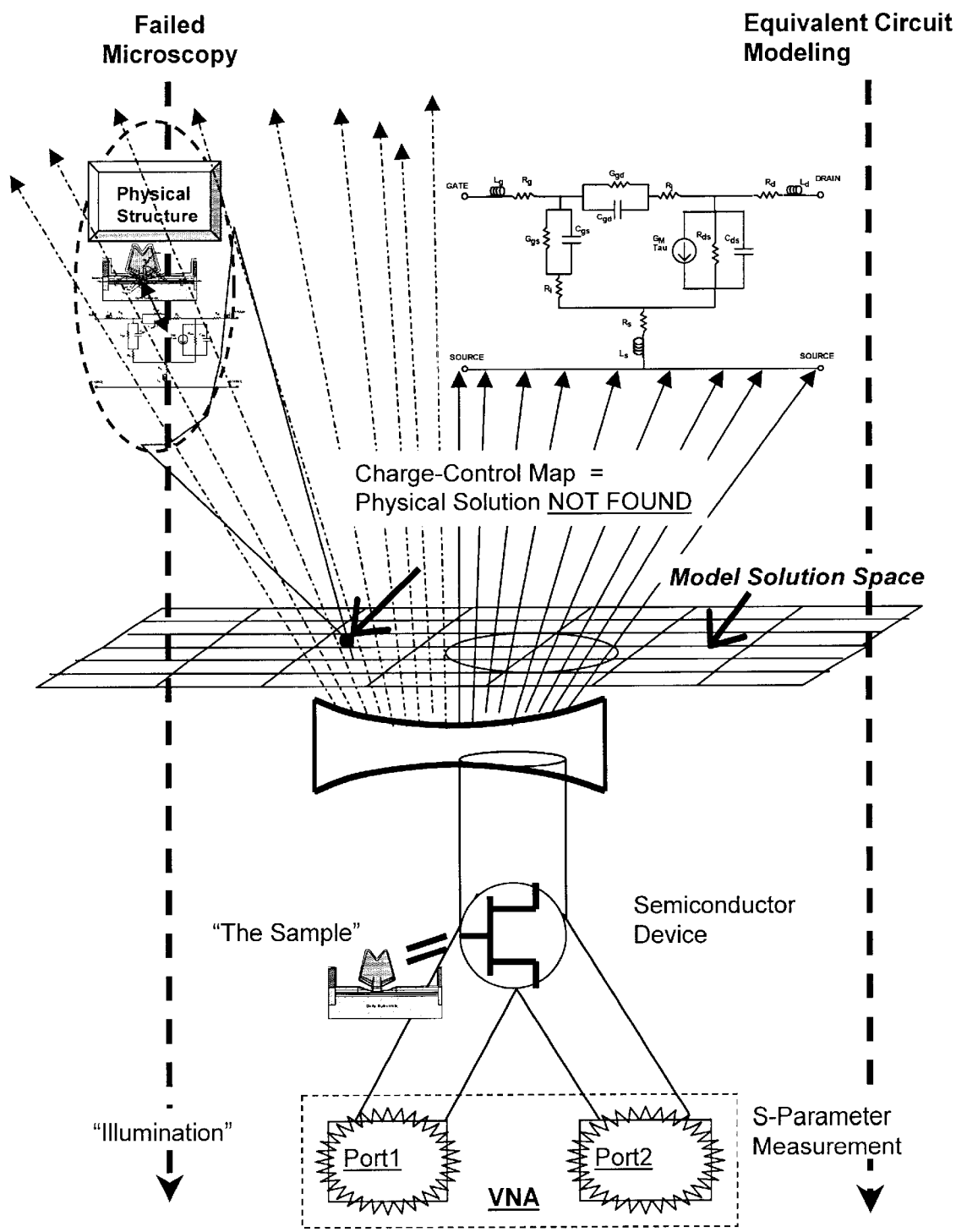
FIG. 10 is similar to FIG. 5 which demonstrates the inability of known systems to accurately predict the internal charge and electrical field structure of a semiconductor device.

Analogous to other forms of microscopy, the S-parameter microscope 20 in accordance with the present invention also emulates a lens, identified with the reference numeral 40 (FIG. 5). The lens 40 is simulated by a method for the extraction of a unique equivalent circuit model that also accurately simulates the measured S-parameter. More particularly, parameter extraction methods for equivalent circuit models that simulate S-parameters are relatively well known. However, when the only goal is accurately fitting measuring S-parameters, an infinite number of solutions exist for possible equivalent circuit parameter values. Thus, in accordance with an important aspect of the present invention, only a single unique solution is extracted which accurately describes the physical charge control map of the device. This method for unique extraction of equivalent circuit model parameters acts as a lens to focus the charge control map solution. As discussed and illustrated herein, the lens 40 is subsequently simulated by a filter that is based on an apparent layout parasitic embedding model. As discussed below, the layout parasitic embedding model consists of linear elements which simulate the effect of the device's electrodes and interconnects upon its external electrical characteristics. A Pi FET embedding model 42, as described below. This model effectively acts as a filter to remove the electrical structure of the extrinsic parasitic access contribution to the preliminary charge control map solution. The resultant, filtered charge control map solution represents a clearer "image" which shows only the electrical structure of the intrinsic device. This enhanced imaging is needed in order to achieve as accurate a view of the internal electrical charge/field as possible. Unlike conventional extraction techniques as illustrated in FIG. 10, which can only extract non-unique equivalent circuit models and not the unique charge control map, the S-parameter microscope 20 in accordance with the present invention is able to relatively accurately model the internal electric charge/field structure within a semiconductor device.

Figure 11:
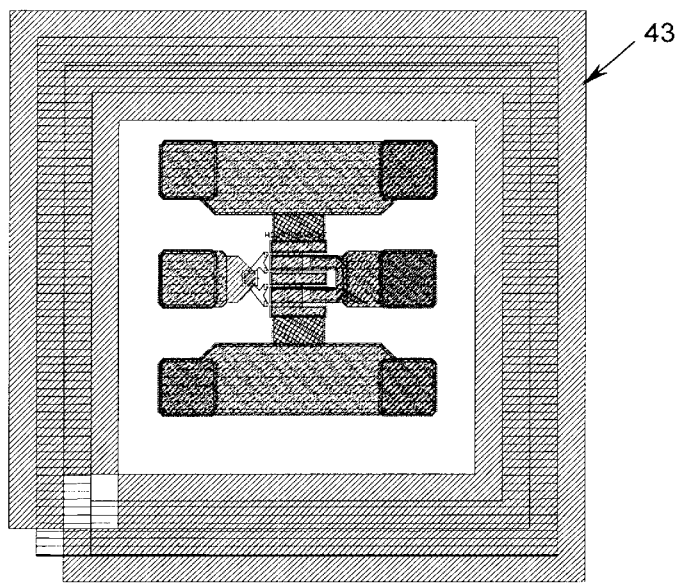
FIG. 11 is a plan view of a four-fingered, 200 $\mu$m GaAs HEMT device.

An exemplary application of the S-parameter microscope is illustrated in detail below. In this example, an exemplary GaAs HEMT device with four gate fingers and 200 $\mu$m total gate periphery formed in a Pi-FET layout as generally illustrated in FIG. 11 and identified with the reference numeral 43, is used. The GaAs HEMT 42 is adapted to be embedded in a 100-$\mu$m pitch coplanar test structure to facilitate on water S-parameter measurement.

Figure 12:
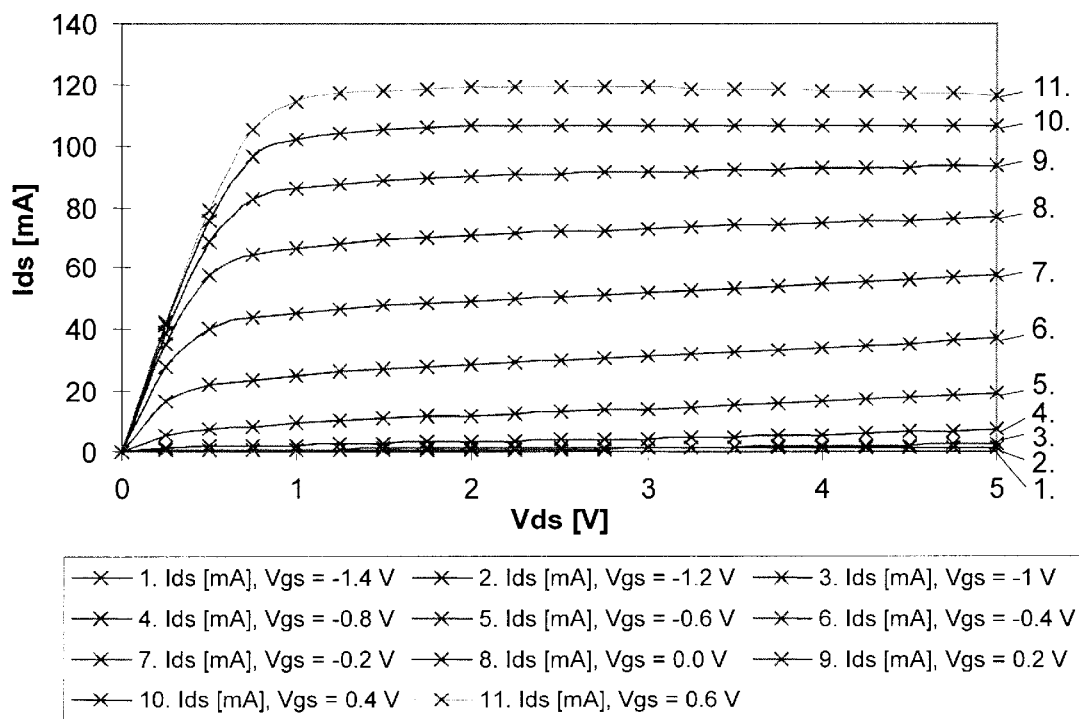
FIG. 12 is a graphical illustration illustrating the measured drain-to-source current $I_{ds}$ as a function of drain-to-source voltage Vds for the sample FET device illustrated in FIG. 11.
Figure 13:
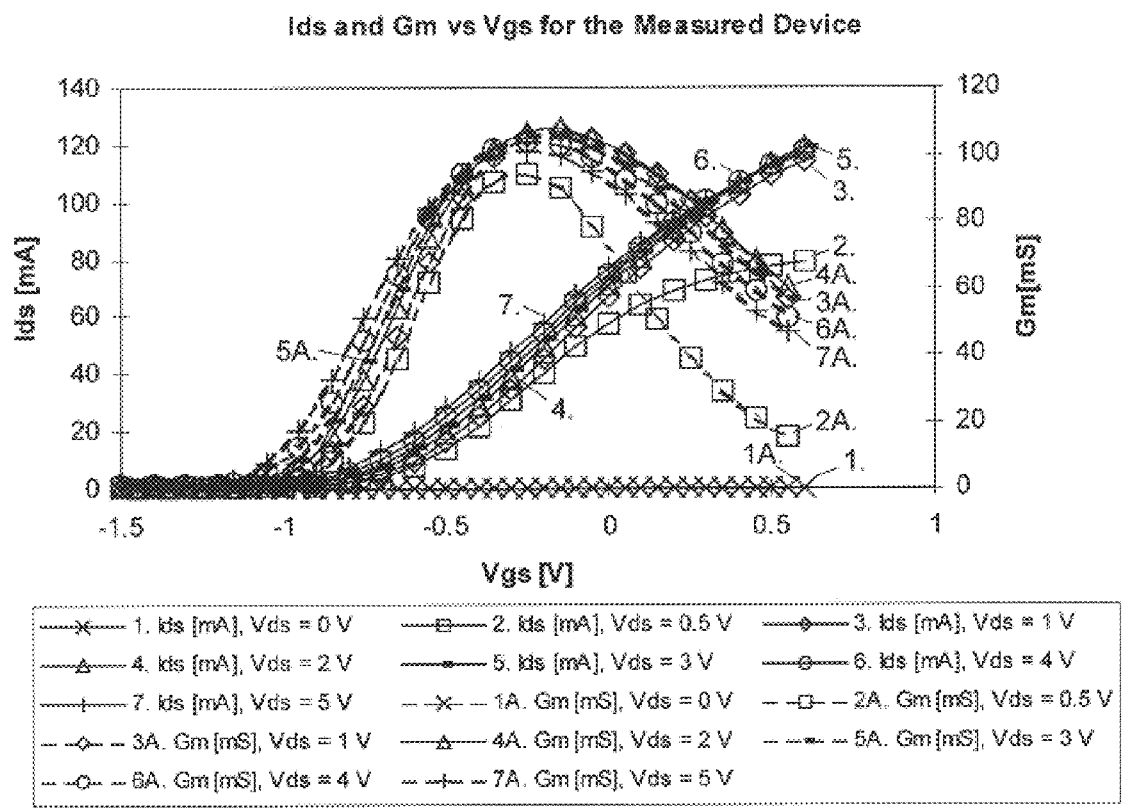
FIG. 13 is a graphical illustration illustrating the drain-to-source current $I_{ds}$ and transconductance $G_m$ as a function of the gate-to-source voltage $V_{gs}$ of the sample FET device illustrated in FIG. 11.

Initially, as illustrated in FIGS. 12 and 13, the I-V characteristics for the device are measured. In particular, the drain source current Ids is plotted as a function of drain-to-source voltage Vds at various gate voltages Vgs as shown in FIG. 12. FIG. 13 illustrates the drain-to-source current Ids as a function of gate voltage Vgs and transconductance Gm (i.e. the derivative of Ids with respect to Vgs) at different drain voltages Vds. These I-V characteristics are typical of HEMT devices and most semiconductor devices, which are on type of three-terminal semiconductor device technology.

Figure 14:
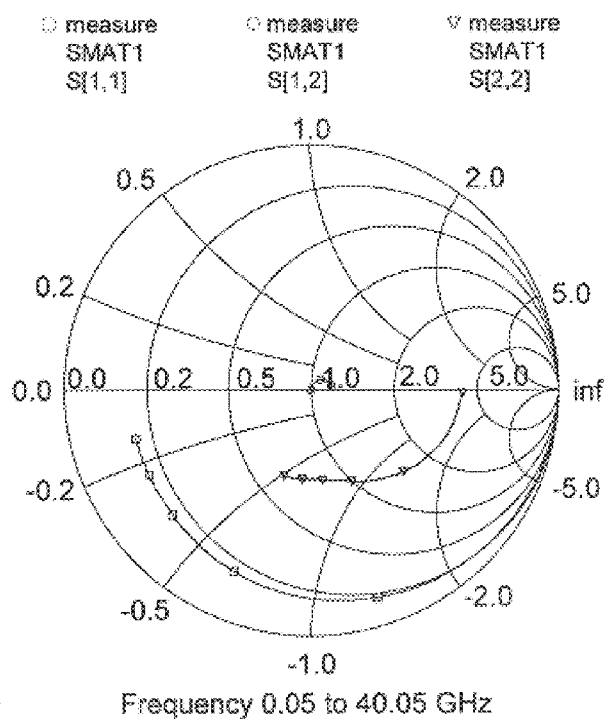
FIG. 14 is a Smith chart illustrating the measured S11, S12 and S22 parameters from frequencies of 0.05 to 40.0 GHZ for the FET device illustrated in FIG. 11.
Figure 15:
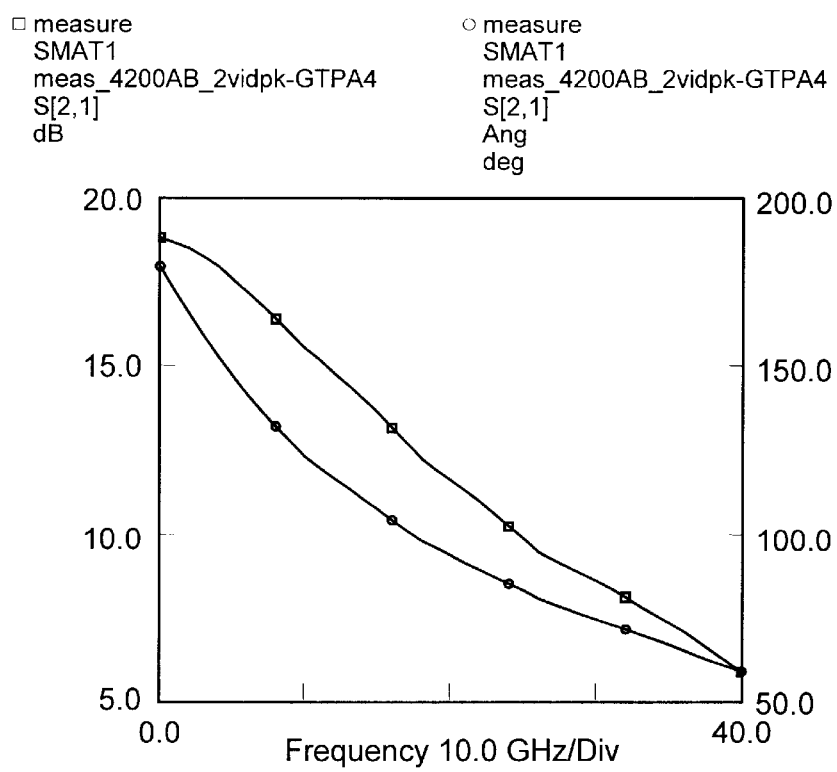
FIG. 15 is a graphical illustration of the magnitude as a function of angle for the S21 S-parameter for frequencies of 0.05 to 40 GHz for the exemplary FET illustrated in FIG. 11.

Table 2 shows the bias conditions in which S-parameters were measured. The S-parameters were measured from 0.05 to 40 GHz at each bias condition. FIG. 14 illustrates a Smith chart illustrating the measured S-parameters S11, S12 and S22 for frequencies from 0.05 to 40.0 GHz. FIG. 15 is a graphical illustration of magnitude as a function of angles for the measured S-parameter S21 for frequencies from 40.05 to 40.0 GHz.

TABLE 2

Measured S-parameter Bias Conditions

| Biases Vgs | Vds = 0 V | Vds = 0.5V | Vds = 1.0 V | Vds = 2.0 V | Vds = 4.0 V | Vds = 5.0 V |
|---|---|---|---|---|---|---|
| −1.6 V | Yes | Yes | Yes | Yes | Yes | Yes |
| −1.4 V | Yes | Yes | Yes | Yes | Yes | Yes |
| −1.2 V | Yes | Yes | Yes | Yes | Yes | Yes |
| −1 V | Yes | Yes | Yes | Yes | Yes | Yes |
| −0.8 V | Yes | Yes | Yes | Yes | Yes | Yes |
| −0.6 V | Yes | Yes | Yes | Yes | Yes | Yes |
| −0.4 V | Yes | Yes | Yes | Yes | Yes | Yes |
| −0.2 V | Yes | Yes | Yes | Yes | Yes | Yes |
| 0 V | Yes | Yes | Yes | Yes | Yes | Yes |
| 0.2 V | Yes | Yes | Yes | Yes | Yes | Yes |
| 0.4 V | Yes | Yes | Yes | Yes | Yes | Yes |
| 0.6 V | Yes | Yes | Yes | Yes | Yes | Yes |

Using the small signal model illustrated in FIG. 8, the extracted small signal equivalent circuit values are obtained as illustrated in Table 3 for each S-parameter at each bias condition, using the extraction method discussed below.

TABLE 3

Bias-dependent Small-signal Equivalent Circuit Models

| Vd [V] | Vg [V] | Rg + Ri [W] | Rs [W] | Rd [W] | Lg [nH] | Ls [nH] | Ld [nH] | Cgs [pF] | Cdg [pF] | Cds [pF] | Gm [mS] | Rds [W] | Tau [pS] | Rgs [W] | Rgd [W] |
|---|---|---|---|---|---|---|---|---|---|---|---|---|---|---|---|
| 0 | -2 | 4.32849 | 0.51256 | 4.2 | 0.01972 | 0.00001 | 0.02650 | 0.04154 | 0.04154 | 0.04324 | 0 | 1000000000 | 0 | 90000000 | 90000000 |
| 0 | -1.6 | 4.11231 | 0.52 | 4 | 0.028 | 0 | 0.0245 | 0.045 | 0.045 | 0.045 | 0 | 1000000000 | 0 | 87000 | 87000 |
| 0 | -1.4 | 3.01231 | 0.55 | 3.53898 | 0.02754 | 0.00001 | 0.02343 | 0.05012 | 0.05012 | 0.04674 | 0 | 1000000 | 0 | 70000 | 70000 |
| 0 | -1.2 | 3.97956 | 0.58579 | 3.92313 | 0.02740 | 0.00001 | 0.02455 | 0.05497 | 0.05497 | 0.04674 | 0 | 3532.954 | 0 | 59895.6 | 59895.6 |
| 0 | -1 | 3.67822 | 0.58 | 3.7 | 0.02634 | 0.00123 | 0.0253 | 0.06322 | 0.06322 | 0.047 | 0 | 200 | 0 | 60000 | 60000 |
| 0 | -0.8 | 3.67134 | 0.58 | 3.67134 | 0.02622 | 0.00347 | 0.02597 | 0.08009 | 0.08009 | 0.04883 | 0 | 51.8679 | 0 | 60000 | 60000 |
| 0 | -0.6 | 3.39996 | 0.59579 | 3.50319 | 0.02764 | 0.00353 | 0.02398 | 0.0923 | 0.0923 | 0.15973 | 0 | 7.84388 | 0 | 97000000 | 97000000 |
| 0 | -0.4 | 3.33401 | 1.76777 | 3.3 | 0.02324 | 0.00356 | 0.03387 | 0.10025 | 0.10025 | 0.18057 | 0 | 6.65812 | 0 | 65565.93 | 65565.93 |
| 0 | -0.2 | 3.31632 | 1.76777 | 3.3 | 0.02421 | 0.00347 | 0.03443 | 0.10446 | 0.10446 | 0.42106 | 0 | 4.75859 | 0 | 58682.78 | 58682.78 |
| 0 | 0 | 3.09963 | 1.41421 | 3.5 | 0.01566 | 0.00334 | 0.03144 | 0.10768 | 0.10768 | 0.45837 | 0 | 3.49009 | 0 | 55000 | 55000 |
| 0 | 0.2 | 3.16448 | 1.28033 | 3.30807 | 0.02664 | 0.00384 | 0.02818 | 0.11001 | 0.11001 | 1.67455 | 0 | 1.40002 | 0 | 16926.72 | 16926.72 |
| 0 | 0.6 | 2.45244 | 1.41421 | 2.61956 | 0.02664 | 0.00352 | 0.02845 | 0.12479 | 0.12479 | 2.02904 | 0 | 1.25101 | 0 | 3811.933 | 3811.933 |
| 0 | 0.755 | 2.48828 | 1.5 | 2.3 | 0.01881 | 0.00320 | 0.03089 | 0.14170 | 0.14170 | 2 | 0 | 2.94325 | 0 | 478.3791 | 478.3791 |
| 0.5 | -1.6 | 4.31968 | 0.5 | 4 | 0.03374 | 0.0 | 0.01699 | 0.04725 | 0.03892 | 0.04621 | 0.22384 | 1.02E+08 | 0.12638 | 100403 | 8.10E+07 |
| 0.5 | -1.4 | 4.80961 | 0.5 | 3.53898 | 0.02817 | 0.0 | 0.02476 | 0.05172 | 0.03907 | 0.04440 | 0.5 | 1000000 | 0 | | |
| 0.5 | -1.2 | 4.24223 | 0.5 | 3.92313 | 0.02913 | 0.00030 | 0.02260 | 0.05921 | 0.03981 | 0.04616 | 0.73207 | 1.08E+08 | 0.67233 | 24714.05 | 9.23E+07 |
| 0.5 | -1 | 3.91986 | 0.85355 | 3.7 | 0.02881 | 0.00354 | 0.02758 | 0.07264 | 0.03983 | 0.04586 | 5.67280 | 7.00E+02 | 0.24830 | 9.90E+07 | 98010 |
| 0.5 | -0.8 | 3.25620 | 0.7 | 3.67134 | 0.02841 | 0.00319 | 0.02461 | 0.09074 | 0.04253 | 0.04625 | 28.00607 | 254.802 | 0.26110 | 69641.32 | 69641.32 |
| 0.5 | -0.6 | 3.22405 | 0.6 | 3.50319 | 0.02953 | 0.00337 | 0.02583 | 0.10155 | 0.04589 | 0.04748 | 73.80795 | 84.25923 | 0.16328 | 16066.22 | 6.36E+07 |
| 0.5 | -0.4 | 2.78789 | 0.6 | 3.3 | 0.03058 | 0.00343 | 0.02529 | 0.08533 | 0.05957 | 0.0669 | 107.5056 | 38.90041 | 0.0001 | 8.77E+07 | 77782.14 |
| 0.5 | -0.2 | 1.71421 | 0.6 | 3.3 | 0.01976 | 3.78E-09 | 0.02305 | 0.14987 | 0.05706 | 0.35247 | 116 | 9.43176 | 0.03061 | 18440.35 | 9.70E+07 |
| 0.5 | 0 | 0.14250 | 3.3 | 3.4 | 0.02067 | 0.00373 | 0.01532 | 0.16389 | 0.09085 | 0.5 | 108 | 7 | 150.0428 | 1.00E+08 | 1.00E+08 |
| 0.5 | 0.2 | 2.35912 | 3.4 | 3.30807 | 0.01797 | 0.00563 | 0.02082 | 0.21366 | 0.04018 | 1.4 | 100 | 1.45897 | 447.6913 | 9915.727 | 1.00E+08 |
| 0.5 | 0.4 | 1.38062 | 3.5 | 3.00269 | 0.02537 | 0.00556 | 0.02100 | 0.115 | 0.115 | 2 | 85 | 1.2 | 156.7027 | 8630.088 | 9.90E+07 |
| 0.5 | 0.6 | 1.56731 | 3.5 | 2.61956 | 0.03453 | 0.00356 | 0.02748 | 0.219 | 0.00152 | 2.1 | 75 | 1.4 | 0.06 | 28918.35 | 9.90E+07 |
| 1 | -1.6 | 1.54964 | 3.6 | 3.9 | 0.03766 | 0.00001 | 0.01 | 0.04706 | 0.03607 | 0.04717 | 0.03803 | 1.03E+08 | 7354.498 | 10980.53 | 1.02E+08 |
| 1 | -1.4 | 0.04221 | 0.5 | 3.53120 | 0.04292 | 0.00070 | 0.01 | 0.04880 | 0.03632 | 0.04857 | 0.08627 | 1.23E+08 | 0.14547 | 71680.16 | 9.70E+07 |
| 1 | -1.2 | 5.37668 | 0.5 | 4.38390 | 0.02639 | 0.0 | 0.03059 | 0.06252 | 0.03581 | 0.04551 | 1.39122 | 1.03E+08 | 0.81815 | 42870.63 | 1.00E+08 |
| 1 | -1 | 3.73022 | 0.6 | 3.7 | 0.03139 | 0.00013 | 0.02741 | 0.07956 | 0.03434 | 0.04721 | 8.76451 | 6.96E+07 | 0.24286 | 9.80E+07 | 97029.9 |
| 1 | -0.8 | 2.83050 | 2.6 | 3.35829 | 0.02891 | 0.00373 | 0.02546 | 0.10424 | 0.03365 | 0.04472 | 37.04396 | 266.1964 | 0.50008 | 54006.62 | 136132.8 |
| 1 | -0.6 | 3.38450 | 0.6 | 2.68486 | 0.02976 | 0.00429 | 0.02666 | 0.12806 | 0.02974 | 0.04391 | 80.28378 | 132.6002 | 0.39418 | 68255.46 | 136132.8 |
| 1 | -0.4 | 3.00864 | 0.5 | 3.3 | 0.03200 | 0.00355 | 0.02466 | 0.13702 | 0.02568 | 0.05399 | 104.4799 | 113.1406 | 0.15717 | 139239.2 | 153397.8 |
| 1 | -0.2 | 2.20164 | 1 | 5.24976 | 0.03218 | 0.00296 | 0.02378 | 0.14376 | 0.02312 | 0.06141 | 116 | 94.51954 | 0.08080 | 5067.04 | 9.70E+07 |
| 1 | 0 | 1.77701 | 1.4 | 6.13975 | 0.03204 | 0.00341 | 0.02626 | 0.14735 | 0.02295 | 0.06126 | 108 | 116.7009 | 0.12469 | 82594.56 | 153397.8 |
| 1 | 0.2 | 2.04598 | 1.2 | 3.76638 | 0.03031 | 0.00405 | 0.02666 | 0.15401 | 0.02543 | 0.06518 | 100 | 97.92344 | 0.26864 | 62352.54 | 159626.4 |
| 1 | 0.4 | 2.25956 | 1.1 | 0.67552 | 0.03023 | 0.00451 | 0.02972 | 0.15538 | 0.03258 | 0.09048 | 82.93733 | 46.7057 | 0.22237 | 62140.25 | 143076.9 |
| 1 | 0.6 | 2.11654 | 1.4 | 1.20729 | 0.02779 | 0.00522 | 0.02767 | 0.15025 | 0.04746 | 0.10476 | 59.0747 | 29.71128 | 0.31347 | 32295.59 | 9.41E+07 |
| 2 | -1.6 | 2.68064 | 1.4 | 0.53210 | 0.02169 | 0.00007 | 0.02902 | 0.04902 | 0.03373 | 0.04284 | 0.01826 | 3.74E+07 | 4.00134 | 86865.89 | 117257.9 |
| 2 | -1.4 | 4.21832 | 0.36612 | 3.64439 | 0.02464 | 0.00351 | 0.02715 | 0.12715 | 0.02715 | | | | | | |
| 2 | -1.4 | 4.21832 | 0.36612 | 3.64439 | 0.02464 | 0.00351 | 0.02715 | 0.15694 | 0.01990 | 0.05282 | 115.9366 | 144.5568 | 0.24960 | 29720.56 | 154931.8 |
| 2 | -1.2 | 4.16045 | 0.35355 | 3.78284 | 0.03206 | 0.0 | 0.00986 | 0.05184 | 0.01906 | 0.04803 | 0.32106 | 2.26E+08 | 1.55689 | 7.62E+07 | 7.62E+07 |
| 2 | -1 | 3.97092 | 0.4 | 3.3 | 0.01991 | 0.00355 | 0.02582 | 0.08850 | 0.03172 | 0.04346 | 14.66729 | 752.2115 | 0.94909 | 11969.85 | 143076.9 |
| 2 | -0.8 | 3.43921 | 0.58579 | 2.95737 | 0.02177 | 0.00369 | 0.02686 | 0.10341 | 0.03367 | 0.04403 | 36.71951 | 267.6627 | 0.52386 | 9.90E+07 | 101000 |
| 2 | -0.6 | 3.14409 | 0.85355 | 3.03268 | 0.02363 | 0.00351 | 0.02706 | 0.15517 | 0.02427 | 0.04545 | 86.93835 | 150.9714 | 0.56213 | 66897.18 | 148886.4 |
| 2 | -0.4 | 2.61645 | 1.06066 | 2.82957 | 0.02464 | 0.00350 | 0.02666 | 0.16323 | 0.02155 | 0.05049 | 109.7086 | 138.1298 | 0.34675 | 138869 | 138869 |
| 2 | -0.2 | 2.16237 | 1 | 4.45931 | 0.02558 | 0.00343 | 0.02524 | 0.15694 | 0.01990 | 0.05282 | 115.9366 | 144.5568 | 0.24960 | 29720.56 | 154931.8 |
| 2 | -5.40E | 2.31075 | 0.9 | 5.63054 | 0.02351 | 0.00358 | 0.02701 | 0.15357 | 0.01906 | 0.04803 | 108.1976 | 157.9708 | 0.36024 | 42443.77 | 143076.9 |

TABLE 3-continued

Bias-dependent Small-signal Equivalent Circuit Models

| Vd [V] | Vg [V] | Rg + Ri [W] | Rs [W] | Rd [W] | Lg [nH] | Ls [nH] | Ld [nH] | Cgs [pF] | Cdg [pF] | Cds [pF] | Gm [mS] | Rds [W] | Tau [pS] | Rgs [W] | Rgd [W] |
|---|---|---|---|---|---|---|---|---|---|---|---|---|---|---|---|
| 2 | −02 | | | | | | | | | | | | | | |
| 2 | 0 | 2.09877 | 0.85355 | 4.76720 | 0.02557 | 0.00359 | 0.02535 | 0.15291 | 0.01879 | 0.05078 | 109.2821 | 155.8182 | 0.27960 | 19029.68 | 125716.3 |
| 2 | 0.2 | 2.64301 | 0.85355 | 3.23486 | 0.0244 | 0.00356 | 0.02808 | 0.15727 | 0.01802 | 0.04871 | 96.42395 | 163.3582 | 0.27618 | 8117.65 | 1.10E+08 |
| 2 | 0.4 | 3.03424 | 0.85355 | 1.80413 | 0.02341 | 0.00356 | 0.02901 | 0.16401 | 0.01776 | 0.04788 | 79.14169 | 171.8245 | 0.33669 | 95099.01 | 1.05E+08 |
| 2 | 0.6 | 3.45639 | 1 | 0.61175 | 0.02245 | 0.00351 | 0.02800 | 0.17494 | 0.01767 | 0.04798 | 63.09272 | 179.6613 | 0.48062 | 47169.75 | 1.27E+08 |
| 4 | −1.6 | 1 | 0.6 | 3.6 | 0.03900 | 0.00007 | 0.01 | 0.04765 | 0.03174 | 0.04984 | 0.11140 | 8.95E+07 | 5.46641 | 15181.61 | 9.90E+07 |
| 4 | −1.4 | 4.71381 | 0.5 | 3.43796 | 0.02063 | 0.00014 | 0.02710 | 0.05937 | 0.03122 | 0.04303 | 1.41022 | 7171.182 | 1.58538 | 8.02E+07 | 1.24E+08 |
| 4 | −1.2 | 4.42193 | 1.3 | 3.2 | 0.02717 | 0.00002 | 0.00124 | 0.07691 | 0.02927 | 0.05239 | 7.58241 | 1.03E+08 | 1.52589 | 75390.74 | 9.51E+07 |
| 4 | −1 | 4.28211 | 1.6 | 3.1306 | 0.02220 | 0.00226 | 0.02517 | 0.11961 | 0.02672 | 0.04456 | 31.09359 | 417.6118 | 1.08238 | 72214.74 | 102010 |
| 4 | −0.8 | 3.92452 | 1.5 | 3.05507 | 0.02333 | 0.00280 | 0.02668 | 0.16912 | 0.02270 | 0.04603 | 68.77447 | 204.0465 | 0.84927 | 35767.7 | 147412.3 |
| 4 | −0.6 | 3.45589 | 1.3 | 3.81853 | 0.02435 | 0.00303 | 0.02526 | 0.19074 | 0.02048 | 0.04833 | 93.20885 | 171.7183 | 0.71106 | 32817.08 | 148886.4 |
| 4 | −0.4 | 3.15713 | 1.3 | 5.52029 | 0.0254 | 0.00245 | 0.02235 | 0.19532 | 0.01899 | 0.05190 | 109.7362 | 167.8084 | 0.57439 | 8.77E+07 | 150375.2 |
| 4 | −0.2 | 3.03221 | 1.4 | 3.87285 | 0.02483 | 0.00311 | 0.02631 | 0.18804 | 0.01819 | 0.04922 | 108.9203 | 184.4907 | 0.56867 | 31725.31 | 148886.4 |
| 4 | 0 | 2.78474 | 1 | 2.7 | 0.02499 | 0.00425 | 0.02735 | 0.17509 | 0.01774 | 0.04685 | 95.97723 | 207.0277 | 0.59343 | 25879.99 | 150375.2 |
| 4 | 0.2 | 3.24209 | 0.9 | 1.48994 | 0.02404 | 0.00381 | 0.02868 | 0.17879 | 0.01685 | 0.04634 | 83.82214 | 212.1484 | 0.55632 | 8.86E+07 | 153397.8 |
| 4 | 0.4 | 3.99720 | 0.8 | 1.2 | 0.02037 | 0.00414 | 0.02095 | 0.20669 | 0.01786 | 0.06562 | 83.82214 | 151.6078 | 0.55632 | 95099.01 | 105101 |
| 4 | 0.6 | 3.85544 | 1 | 1.12128 | 0.02333 | 0.00299 | 0.02312 | 0.19731 | 0.01611 | 0.04746 | 52.91232 | 231.8809 | 0.7537 | 16152.41 | 136132.8 |
| 5 | −1.6 | 3.83032 | 0.4 | 3.6 | 0.02626 | 0.01559 | 0.03312 | 0.04802 | 0.03134 | 0.03869 | 0 | 4592.258 | 0 | 1.00E+09 | 106152 |
| 5 | −1.4 | 4.28848 | 1.4 | 3.4 | 0.02174 | 0.0 | 0.02839 | 0.06338 | 0.03006 | 0.04302 | 2.80405 | 8.62E+07 | 1.60443 | 83451.39 | 119614.8 |
| 5 | −1.2 | 4.21790 | 2 | 3.3 | 0.01536 | 0.00341 | 0.02351 | 0.09669 | 0.03007 | 0.04316 | 0 | 386.3951 | 0 | 19446.95 | 109368.5 |
| 5 | −1 | 4.47178 | 1.8 | 2.87325 | 0.02239 | 0.00199 | 0.02521 | 0.14703 | 0.02426 | 0.04505 | 46.23544 | 293.0981 | 1.08234 | 7.25E+07 | 137494.1 |
| 5 | −0.8 | 3.78294 | 1.5 | 3.46025 | 0.02367 | 0.00317 | 0.02437 | 0.18748 | 0.02118 | 0.04735 | 77.13884 | 195.8661 | 0.88373 | 9.61E+07 | 89446.16 |
| 5 | −0.6 | 3.43996 | 1.5 | 5.26075 | 0.02469 | 0.00289 | 0.02161 | 0.20516 | 0.01940 | 0.05136 | 97.94424 | 177.1967 | 0.70855 | 8.69E+07 | 140364.4 |
| 5 | −0.4 | 3.24864 | 1.1 | 3.41057 | 0.02427 | 0.00372 | 0.02454 | 0.20480 | 0.01867 | 0.04869 | 103.1449 | 189.0745 | 0.74543 | 7.78E+07 | 120940.4 |
| 5 | −0.2 | 3.36600 | 1 | 2.43302 | 0.02418 | 0.00316 | 0.02679 | 0.20094 | 0.01771 | 0.04718 | 102.8015 | 198.7121 | 0.76450 | 9.04E+07 | 6.7628.66 |
| 5 | 0 | 3.66823 | 1 | 1 | 0.02364 | 0.00238 | 0.03020 | 0.20166 | 0.01647 | 0.04563 | 101 | 102.8015 | 0.76450 | 1.13E+08 | 2719.43 |
| 5 | 0.2 | 3.60190 | 1.1 | 0.60143 | 0.02392 | 0.00260 | 0.02939 | 0.20083 | 0.01544 | 0.04509 | 77.64431 | 183.0196 | 0.79705 | 1.08E+08 | 14811.42 |
| 5 | 0.4 | 4.21933 | 1.2 | 0.6 | 0.02300 | 0.00249 | 0.02825 | 0.21695 | 0.01552 | 0.05731 | 65 | 133.1078 | 0.81232 | 1.00E+09 | 8890.916 |
| 5 | 0.6 | 3.80536 | 1.2 | 0.5 | 0.02404 | 0.00292 | 0.02127 | 0.21078 | 0.01532 | 0.04376 | 44 | 157.4825 | 1.20711 | 1.00E+09 | |

The values in Table 3 represent solutions that are close to the charge control map and represent physically significant solutions of the FET's electrical structure. However, the values represented in Table 3 contain the influence of external layout parasitics which, in accordance with an important aspect of the invention, are subtracted using model for the embedding parasitics to obtain the most accurate charge control mapping to the intrinsic device characteristic. In particular, an embedding model is applied to filter the extracted equivalent circuit model values to obtain values more representative of the intrinsic device. In particular, in the exemplary embodiment, a PiFET embedding parasitic model is used to subtract capacitive contributions due to interelectrode and off-mesa layout parasitic influences. This filter essentially subtracts known quantities formed from the parameters Cgs, Cgd and Cds depending on the device layout involved. In this example, embedding of the inductive parameters is not necessary because these quantities are extrinsic and do not contribute to the charge control map of the intrinsic device.

Figure 16:
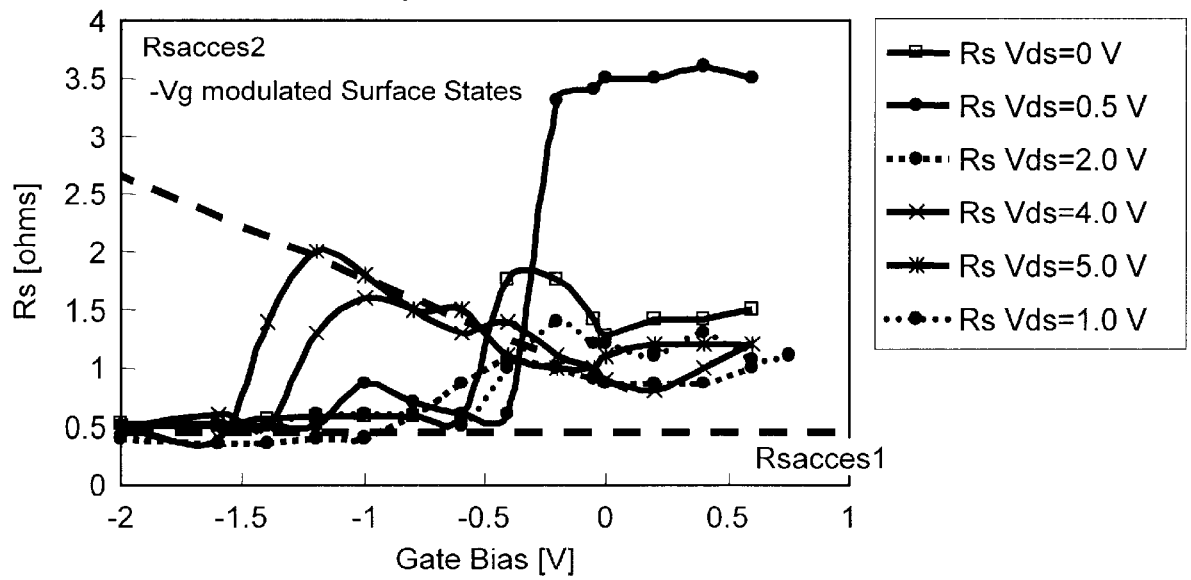
FIG. 16 is a graphical illustration of a charge control map of the charge and electric field distribution in the on mesa source access region shown with $R_s$ as a function bias in accordance with the present invention.
Figure 17:
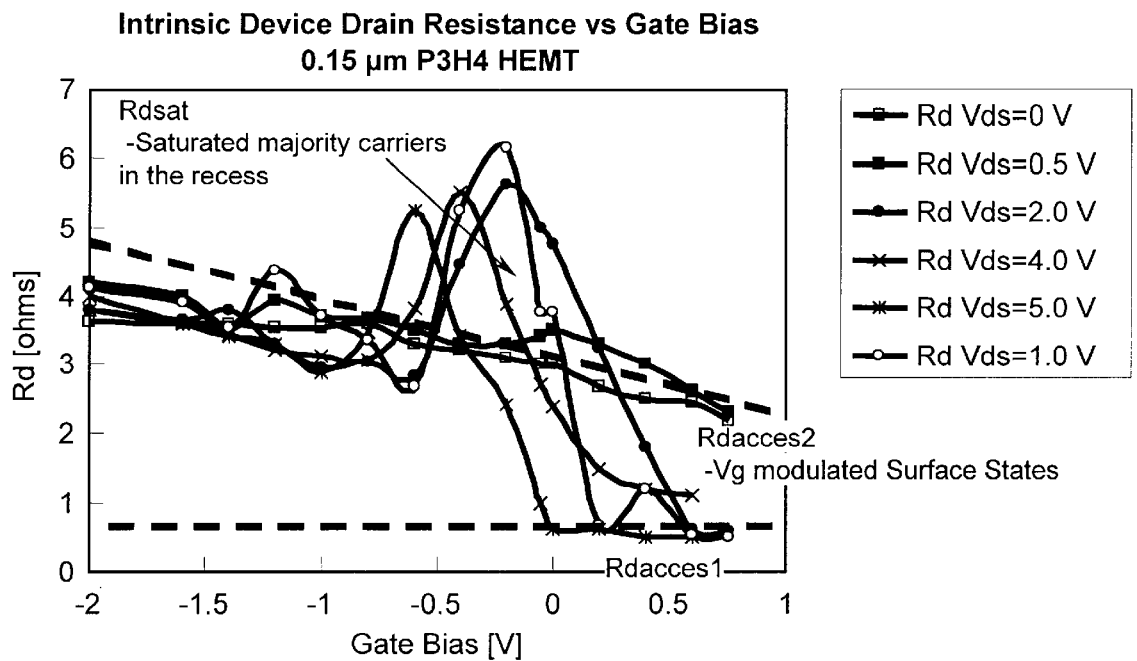
FIG. 17 is a graphical illustration of a charge control map of charge and electric field distribution in the on-mesa drain access region shown with $R_d$ as a function of bias in accordance with the present invention.
Figure 18:
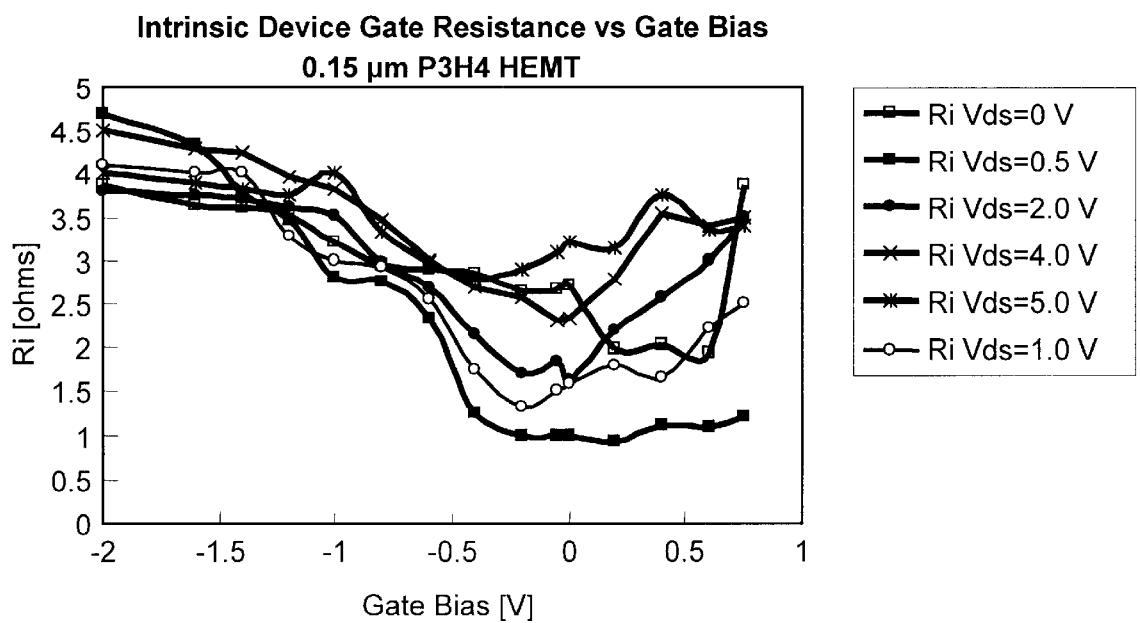
FIG. 18 is a graphical illustration of a charge control map for the non-quasi static majority carrier transport, shown with $R_i$ as a function of bias in accordance with the present invention.
Figure 19:
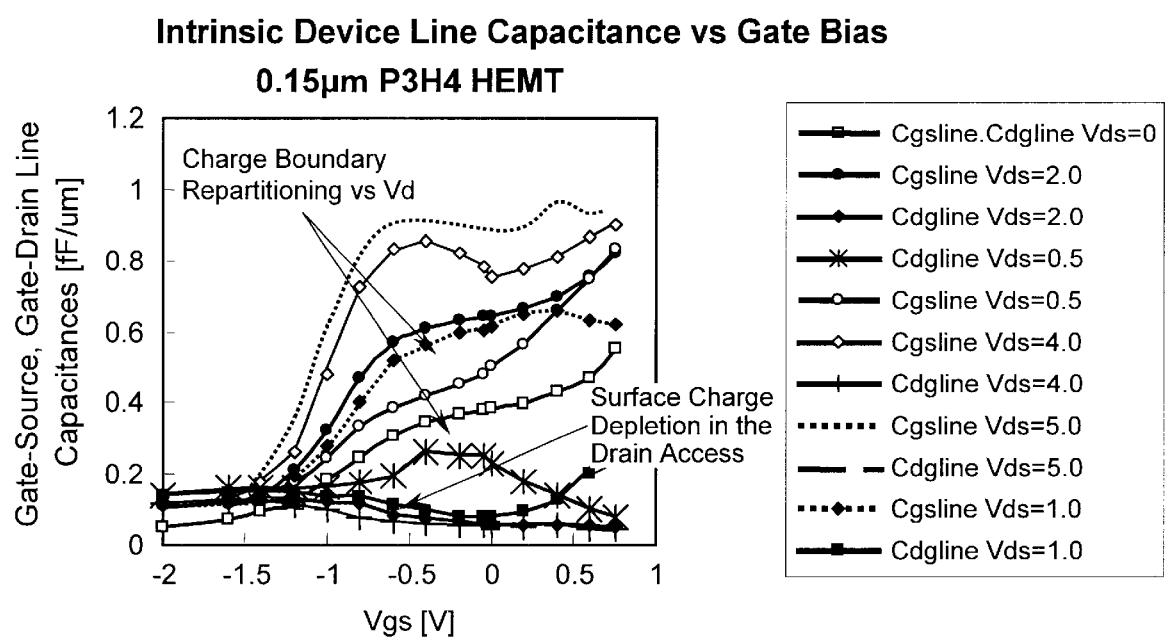
FIG. 19 is a graphical illustration of a charge control map for gate modulated charge and distribution under the gate, shown with Cgs and Cgt as function of bias in accordance with the present invention.

As discussed above, the lens with filter is used to generate unique charge control maps. In particular, FIGS. 15–18 illustrate the bias dependent charge control maps for the parameters RS, RD, RI, CGS and CGD as a function of bias. More particularly, FIG. 15 illustrates a charge control map of the charge and electric field distribution in the on-mesa source access region illustrated by the source resistance $R_s$ as a function of bias. FIG. 16 illustrates a charge control map of the charge and electric field distribution in the on-mesa drain access region illustrated by the drain resistance $R_d$ as a function of bias. FIG. 17 illustrates a charge control map for a non-quasistatic majority carrier transport illustrated by the intrinsic device charging resistance $R_i$ as a function of gate bias for different drain bias points. FIG. 18 illustrates a charge control map for gate modulated charge and distribution under the gate shown with the gate capacitance CGS and CGD as a function of bias.

FILTER

As mentioned above, the S-parameter microscope 20 utilizes a filter to provide a clearer charge control map for modeling the internal electric charge/field of a semiconductor device. Although the filter is illustrated in connection with the PiFET with multiple gate fingers, as illustrated in FIGS. 20 and 21, the principles of the invention are applicable to other semiconductor devices.

Figure 20:
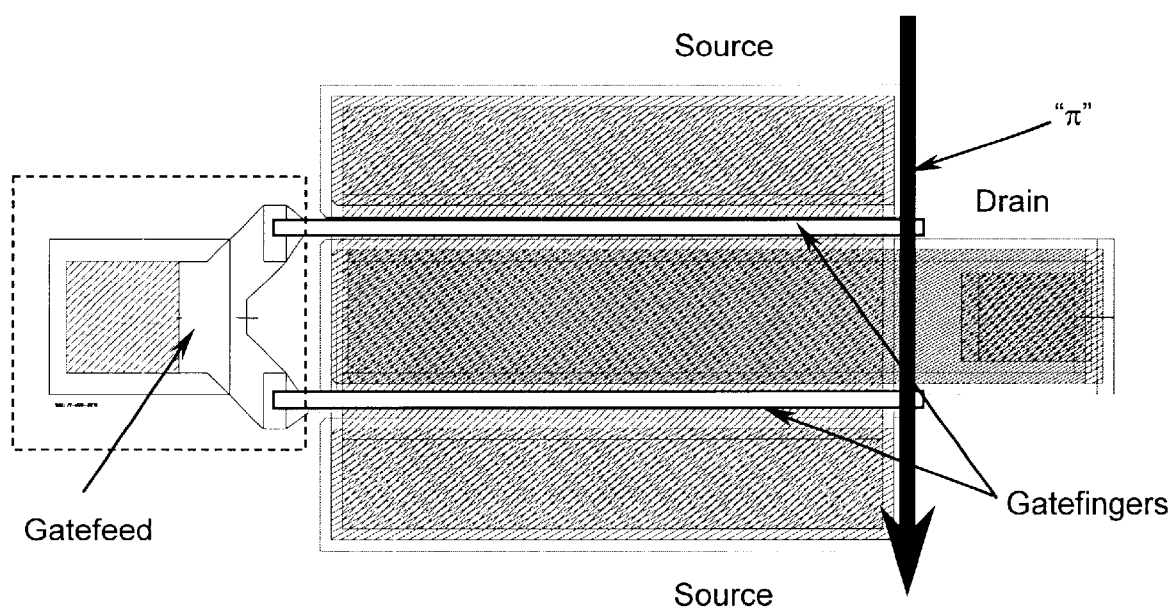
FIG. 20 is a plan view of an exemplary π-FET with two gate fingers.
Figure 21:
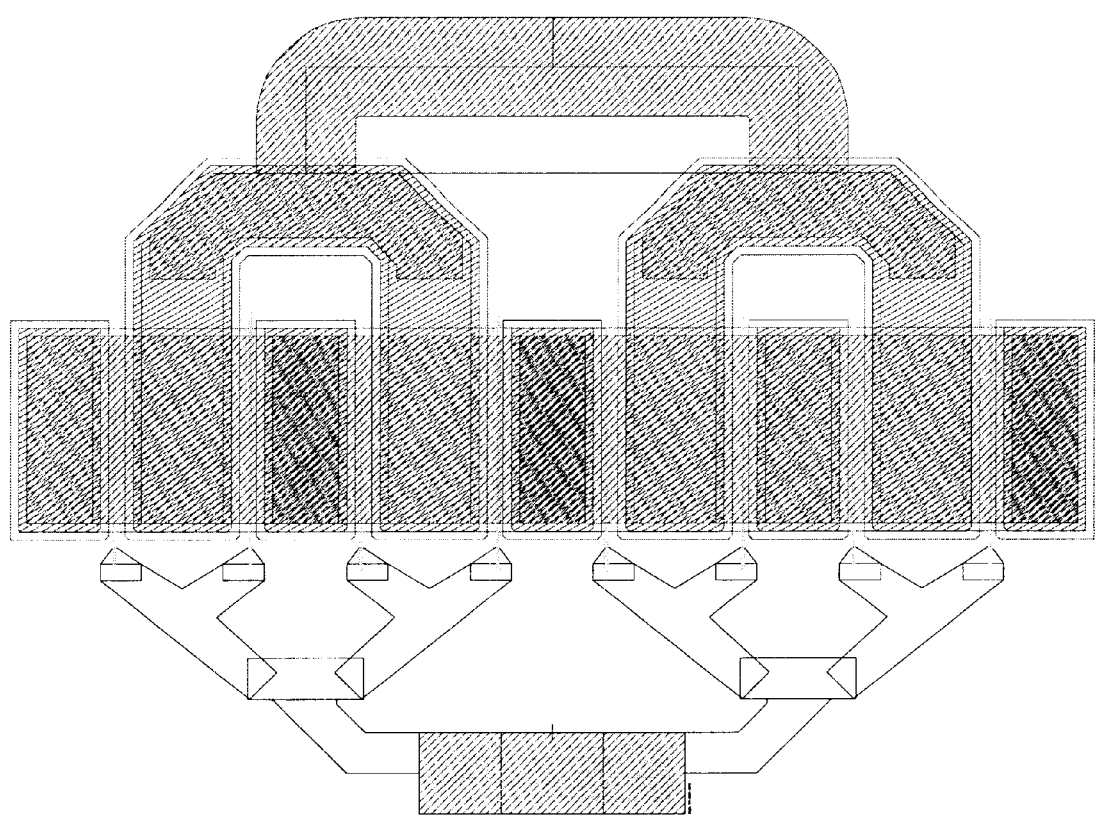
FIG. 21 is a plan view of a π-FET with four gate fingers.
Figure 22:
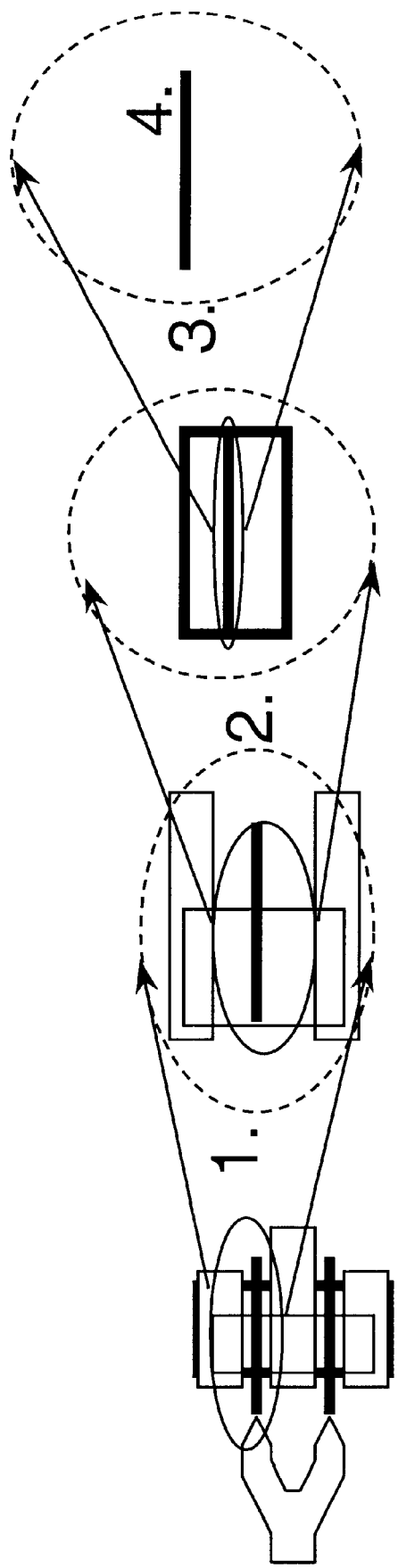
FIG. 22 is an illustration of a π-FET parasitic model in accordance with the present invention.

As illustrated in FIG. 20, PiFETs are devices in which the gate fingers and the edge of the active region resemble the greek letter π, as illustrated. Such PiFET layouts facilitate construction of multi fingered large periphery device cells, for example, as illustrated in FIG. 21. In accordance with an important aspect of the invention, the multi-finger semiconductor device is modeled as a combination of single finger device cells. Each single finger device cell is represented by a hierarchy of four models, which, in turn, are assembled together using models for interconnects to represent an arbitrary multi-fingered device cell, illustrated in FIG. 22. The four models are as follows: off mesa or boundary parasitic model; interelectrode parasitic model; on-mesa parasitic model and intrinsic model.

Figure 23:
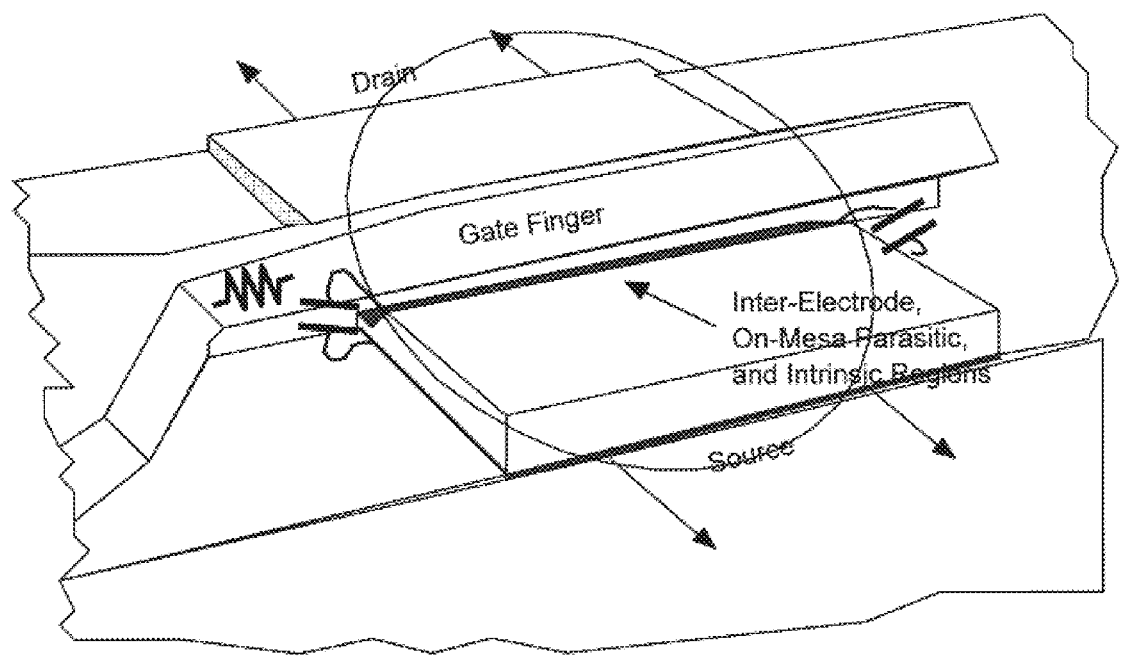
FIG. 23 is an illustration of an off-mesa parasitic model for a π-FET in accordance with the present invention.

The off-mesa parasitic model is illustrated in FIG. 23. This model represents the parasitics that exist outside the active FET region for each gate finger. In this model, the fringing capacitance of each gate finger off the active device region as well as the off-mesa gate finger resistance is modeled.

Figure 24:
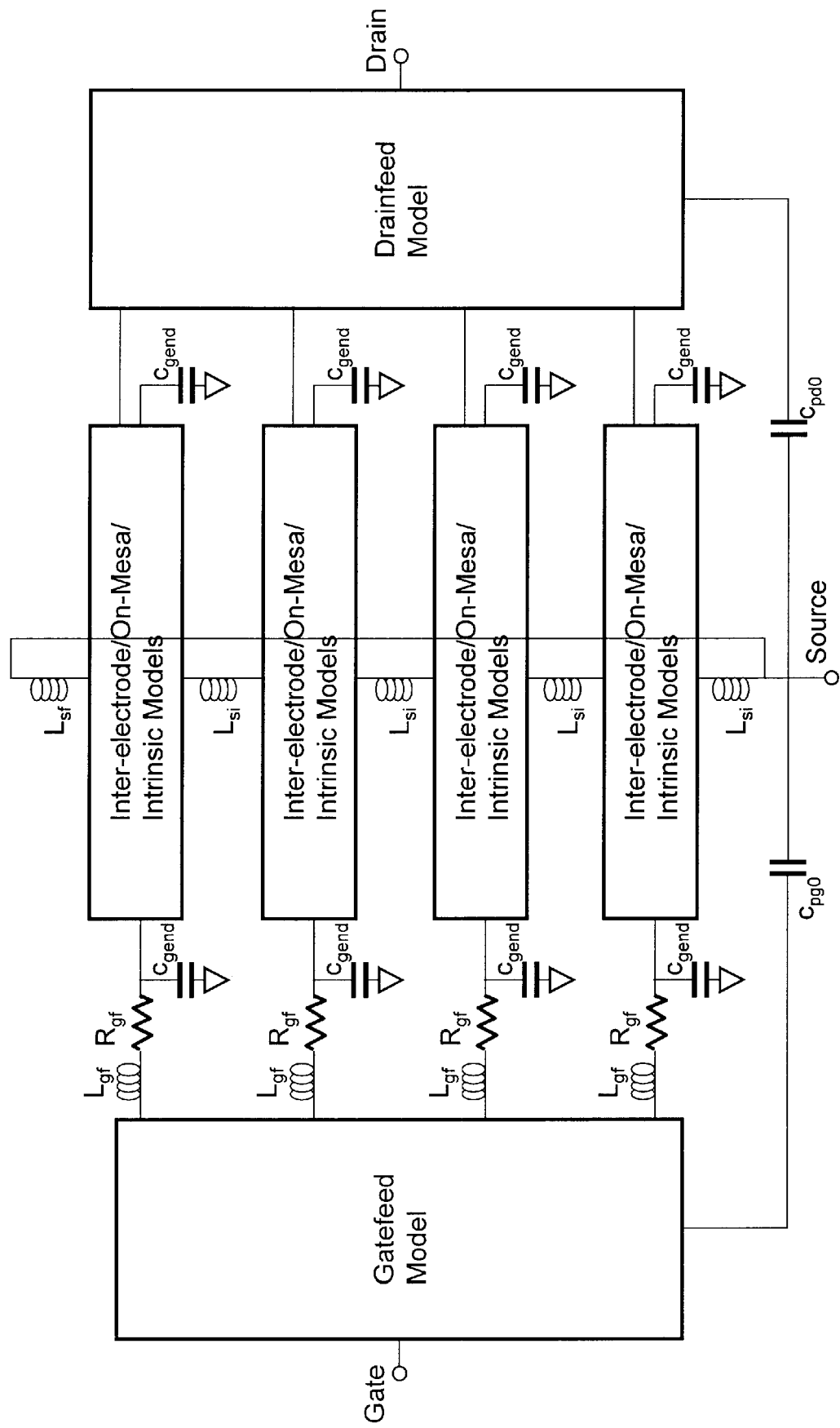
FIG. 24 is an illustration of an interconnect and boundary parasitic model in accordance with the present invention for the π-FET with four gate fingers as illustrated in FIG. 21.
Figure 25:
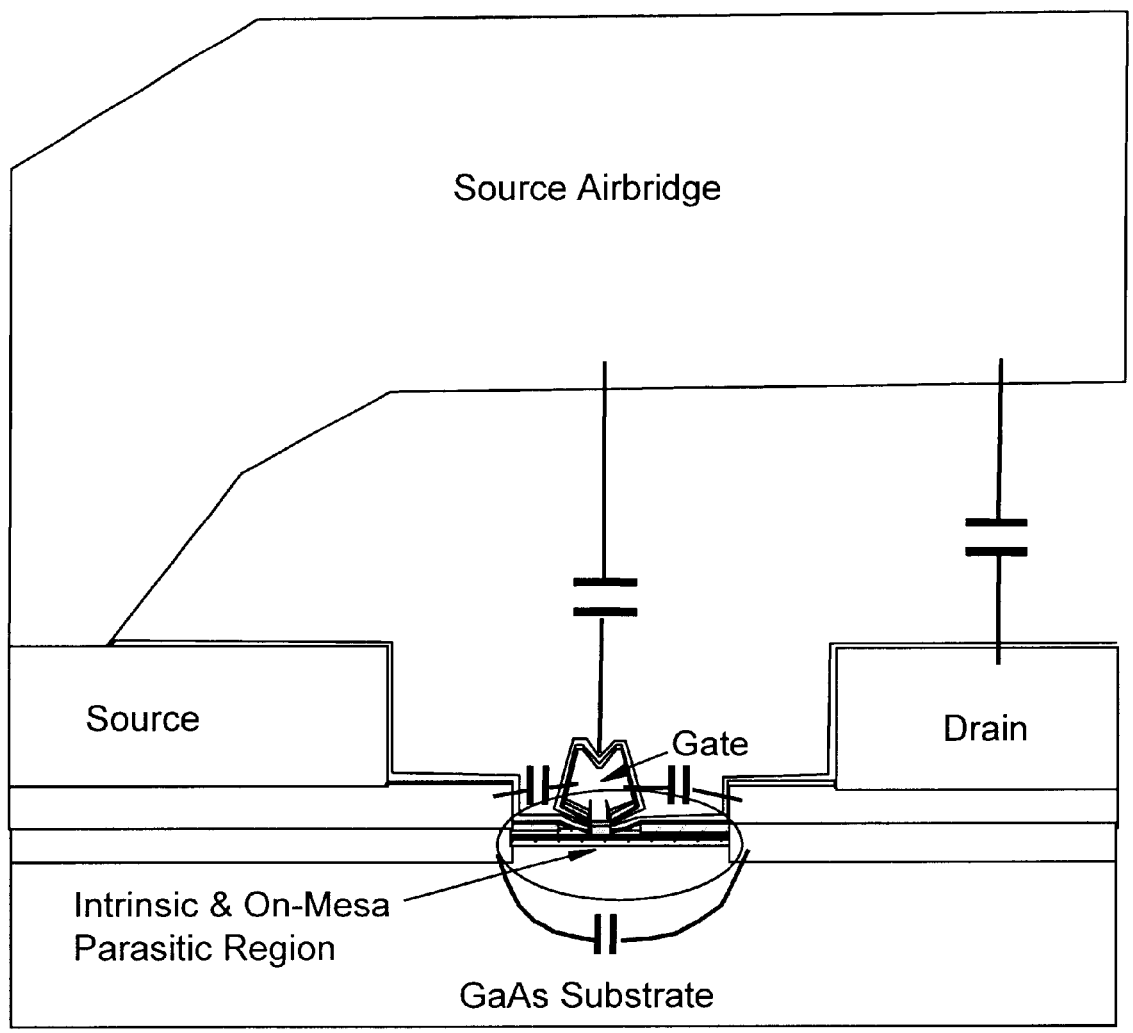
FIG. 25 is an illustration of an inter-electrode parasitic model in accordance with the present invention.
Figure 26:
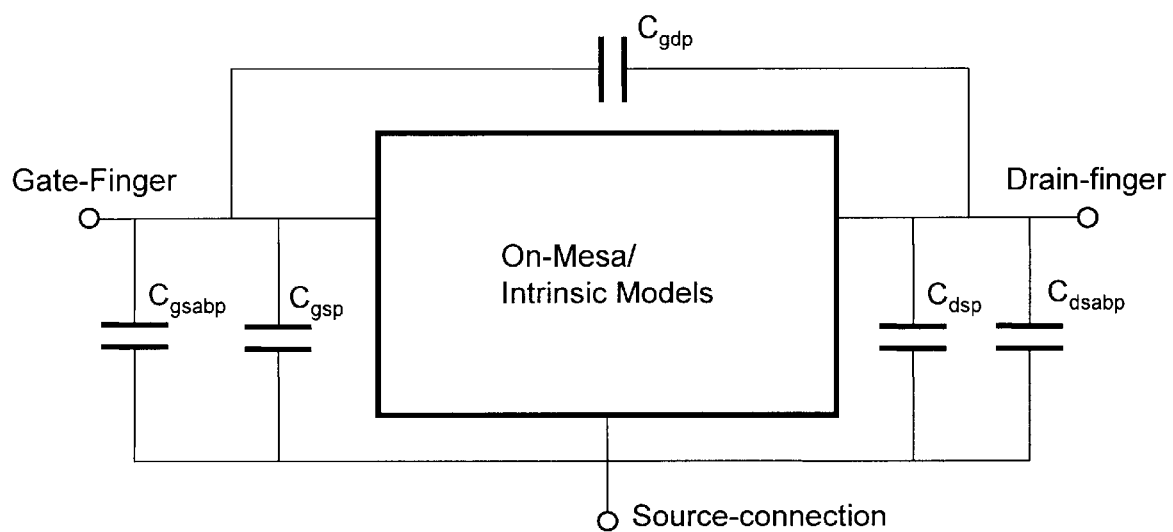
FIG. 26 is a schematic diagram of the inter-electrode parasitic model illustrated in FIG. 25.

The interelectrode parasitic model and corresponding equivalent circuit are illustrated in FIGS. 24–26. This model represents parasitics between the metal electrodes along each gate finger. The following fringing capacitance parasitics are modeled for the gate-to-source air bridge; drain-to-source air bridge; gate-to-source ohmic; gate-to-drain ohmic and source-to-drain ohmic as generally illustrated in FIG. 25.

Figure 27:
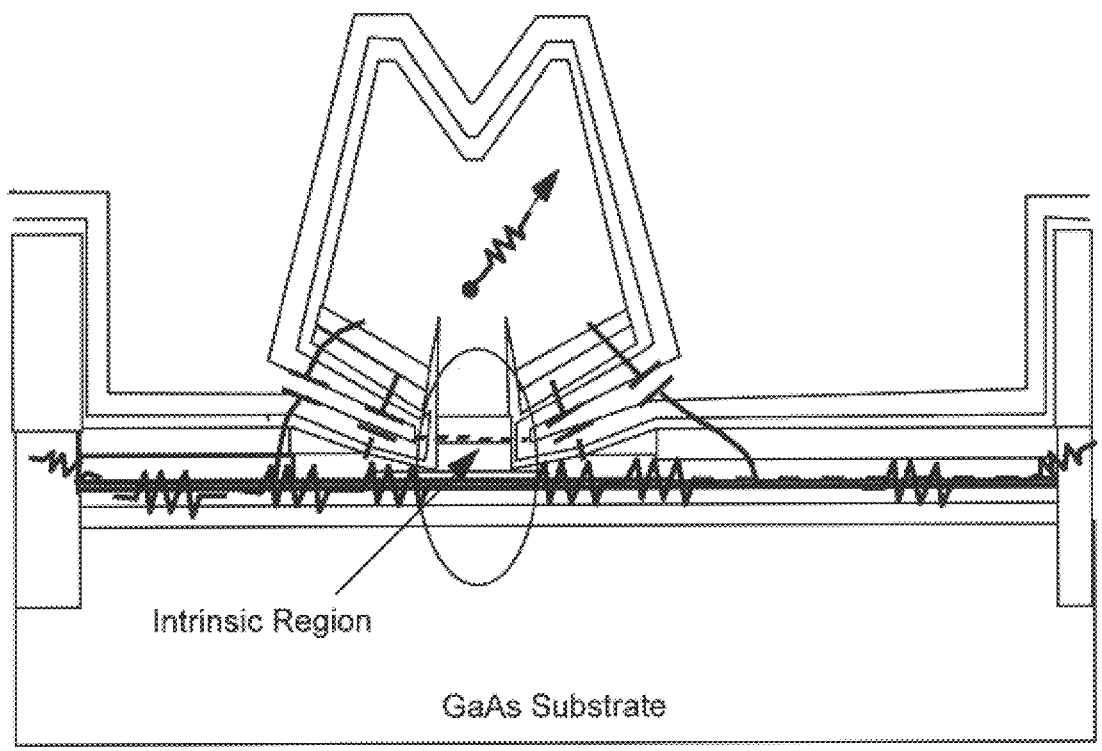
FIG. 27 is an illustration of an on-mesa parasitic model in accordance with the present invention.
Figure 28:
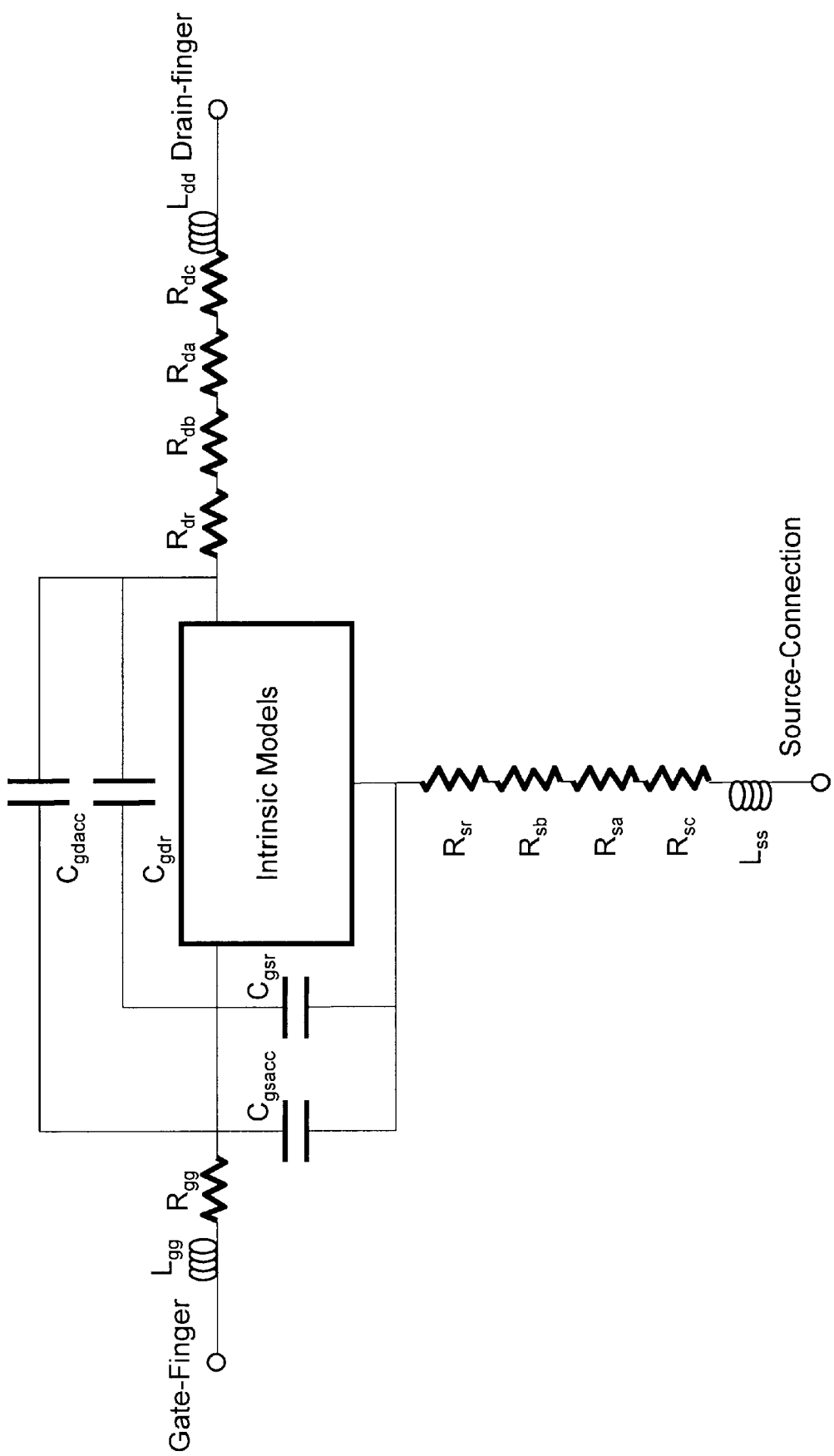
FIG. 28 is a schematic diagram of the on-mesa parasitic model illustrated in FIG. 27.

The on-mesa parasitic model and corresponding equivalent circuit are illustrated in FIGS. 27 and 28. This model represents that parasitics around the active FET region along each gate finger including various capacitance fringing parasitics and resistive parasitics. In particular, the gate-to-source side recess; gate-drain-side recess; gate-source access charge/doped cap; and gate-drain access charge/doped cap capacitance fringing parasitics are modeled. In addition, the gate metallization and ohmic contact resistive parasitics are modeled.

Figure 29:
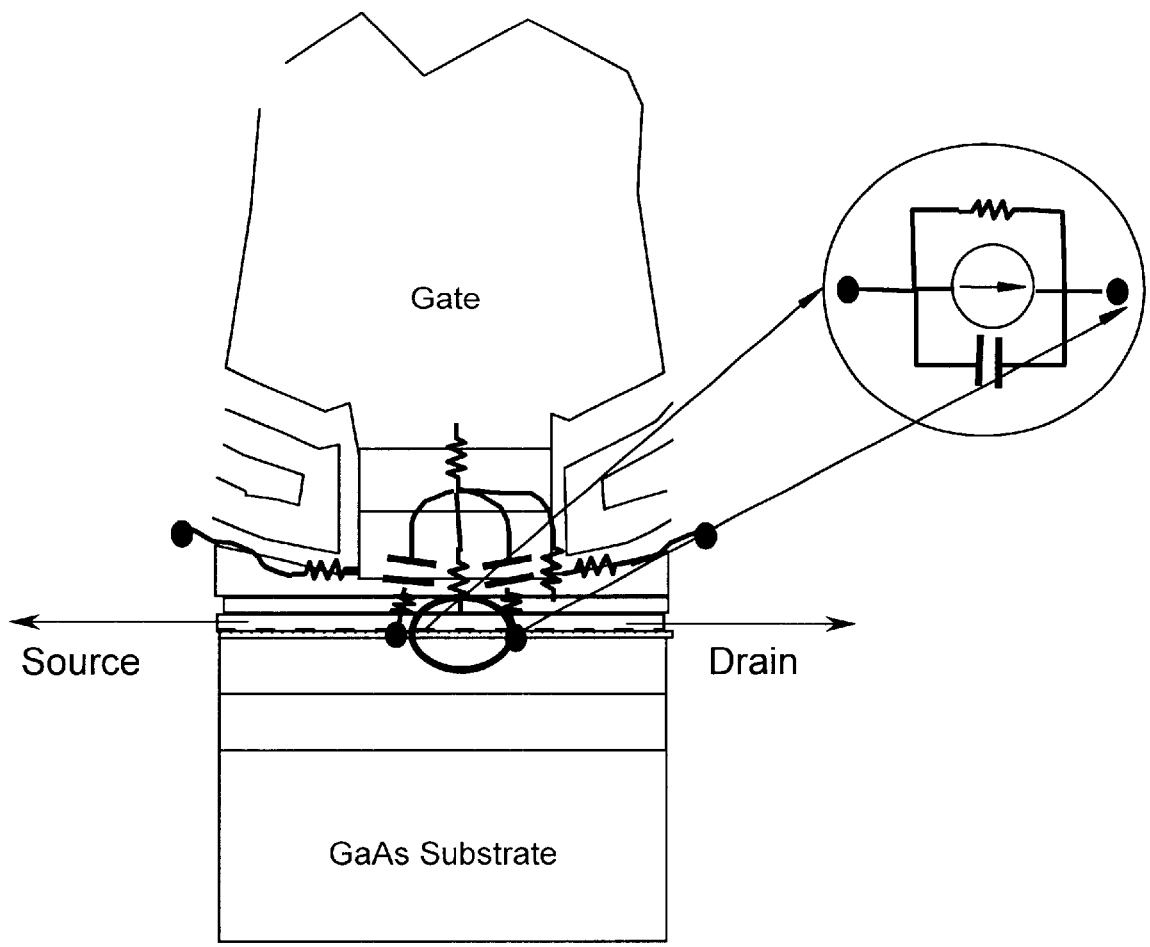
FIG. 29 is an illustration of an intrinsic model in accordance with the present invention.
Figure 30:
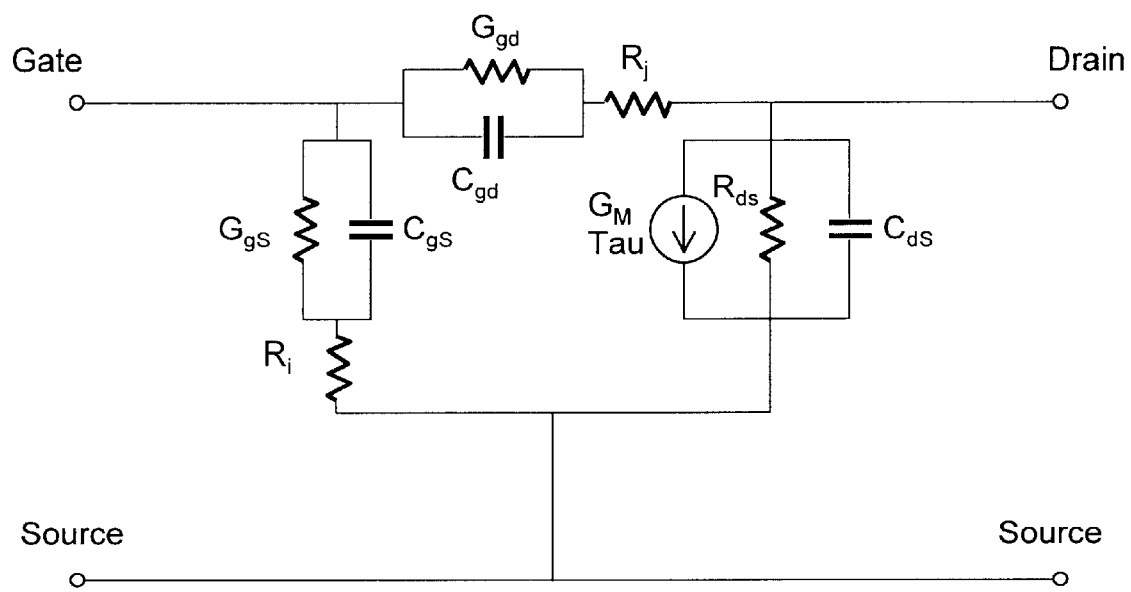
FIG. 30 is a schematic diagram of the intrinsic model illustrated in FIG. 29.

The intrinsic model and corresponding equivalent circuit are illustrated in FIGS. 29 and 30. The intrinsic model represents the physics that predominately determine the FET performance. In particular, the DC and current voltage response can be determined by physics based analytical equations for magnitude and location of intrinsic charge which are generally know in the art, for example, as disclosed in "Nonlinear Charge Control In AlGaAs Modulation-Doped FETs", by Hughes et al, *IEEE Trans. Electron Devices*, vol. ED-34, No. 8, August 1987, hereby incorporated by reference. The small signal model performance is modeled by taking a dervative of the appropriate charge or current control equations to derive various terms such as RI, RJ, RDS, RGS, RGD, GM, TAU, CGS, CDS and CGD. Such control equations are generally known in the art and disclosed in detail in the Hughes et al reference mentioned above, hereby incorporated by reference. The noise performance may be modeled by current or voltage perturbation analysis "Noise Characteristics of Gallium Arsenide Field-Effect Transistors" by H. Statz, et al, *IEEE-Trans. Electron Devices*, vol. ED-21, No. 9, September 1974 and "Gate Noise in Field Effect Transistors at Moderately High Frequencies" by A. Van Der Ziel, *Proc. IEEE*, vol. 51, March 1963.

Figure 3:
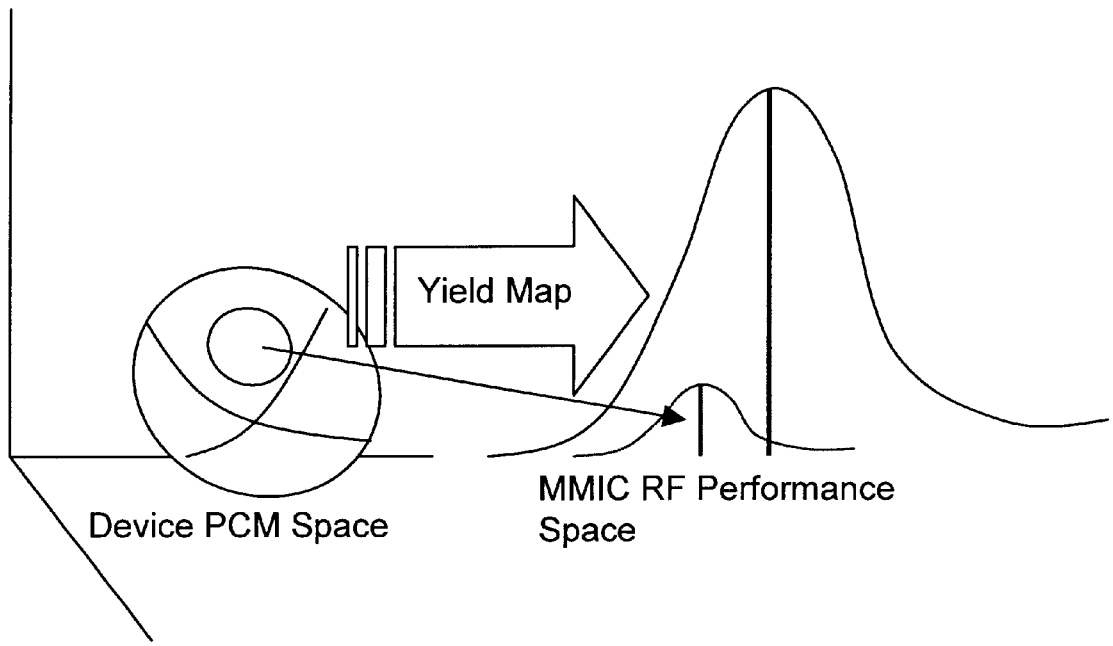
FIG. 3 is an exemplary representation illustrating a known mapping MMIC RF yield forecasting method.
Figure 4:
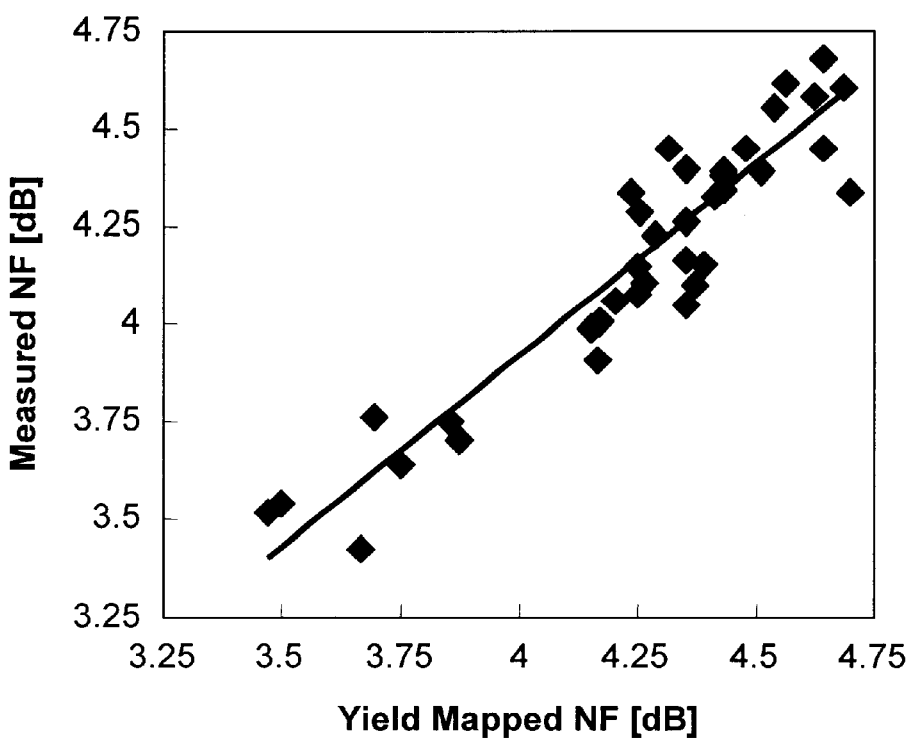
FIG. 4 is a graphical illustration illustrating the measured noise factor versus the mapped noise factor for a 35 GHZ GaAs pHEMT LNA utilizing the method illustrated in FIG. 3.
Figure 31A:
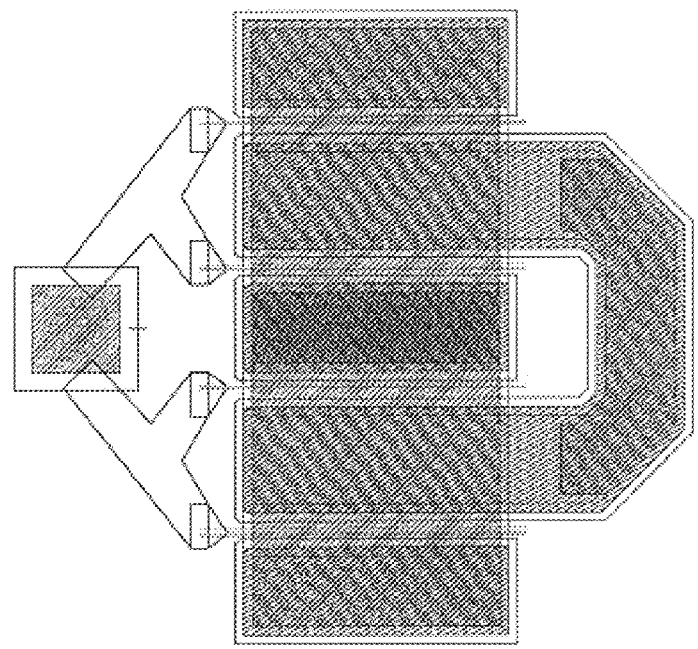
FIG. 31A is an exemplary device layout of a π-FET with four gate fingers.
Figure 31B:
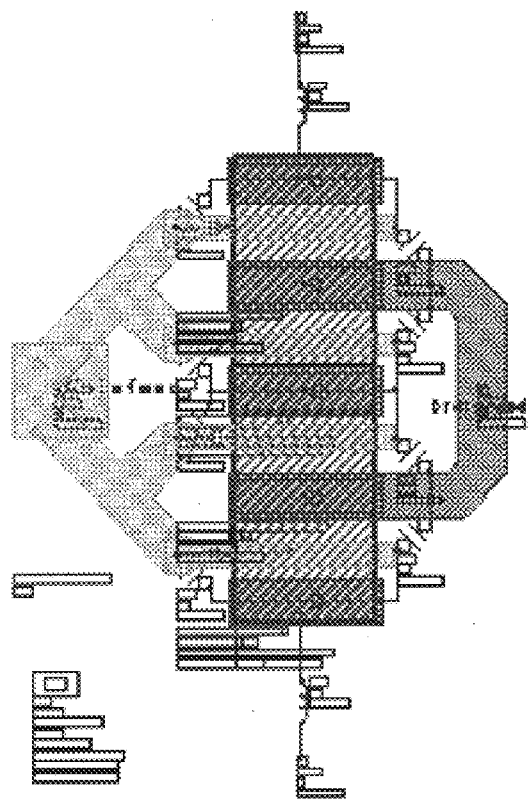
FIG. 31B is an equivalent circuit model for the π-FET illustrated in FIG. 31A.

An example of a parasitic model for use with the S-parameter microscopy discussed above is illustrated in FIGS. 31A–38. Although a specific embodiment of a semiconductor device is illustrated and described, the principles of the present invention are applicable to various semiconductors devices. Referring to FIG. 31A, a Pi-FET is illustrated. As shown, the PiFET has four gate fingers. The four fingered Pi-FET is modeled in FIG. 31B. In particular, FIG. 31B illustrates an equivalent circuit model for Pi-FET illustrated in FIG. 31A as implemented by a known CAD program, for example, LIBRA 6.1 as manufactured by Agilent Technologies. As shown, the equivalent circuit models does not illustrate all of the equivalent circuit elements or network connections involved with implementing the parasitic embedding models, but rather demonstrates a finished product. FIG. 31B is displayed in symbol view in order demonstrate resemblance to FIG. 3. The actual technical information regarding the construction of the network and its equivalent circuit elements are normally provided in schematic view.

FIGS. 32–38 demonstrate the application of the parasitic model for use with the S-parameter microscopy. An important aspect of the invention relates to modeling of multi-gate fingered devices as single gate finger devices. As used herein, a single unit device cell refers to a device associated with a single gate finger. For example, a four fingered Pi-FET as illustrated in FIG. 31A is modeled as four unit device cells.

Figure 32:
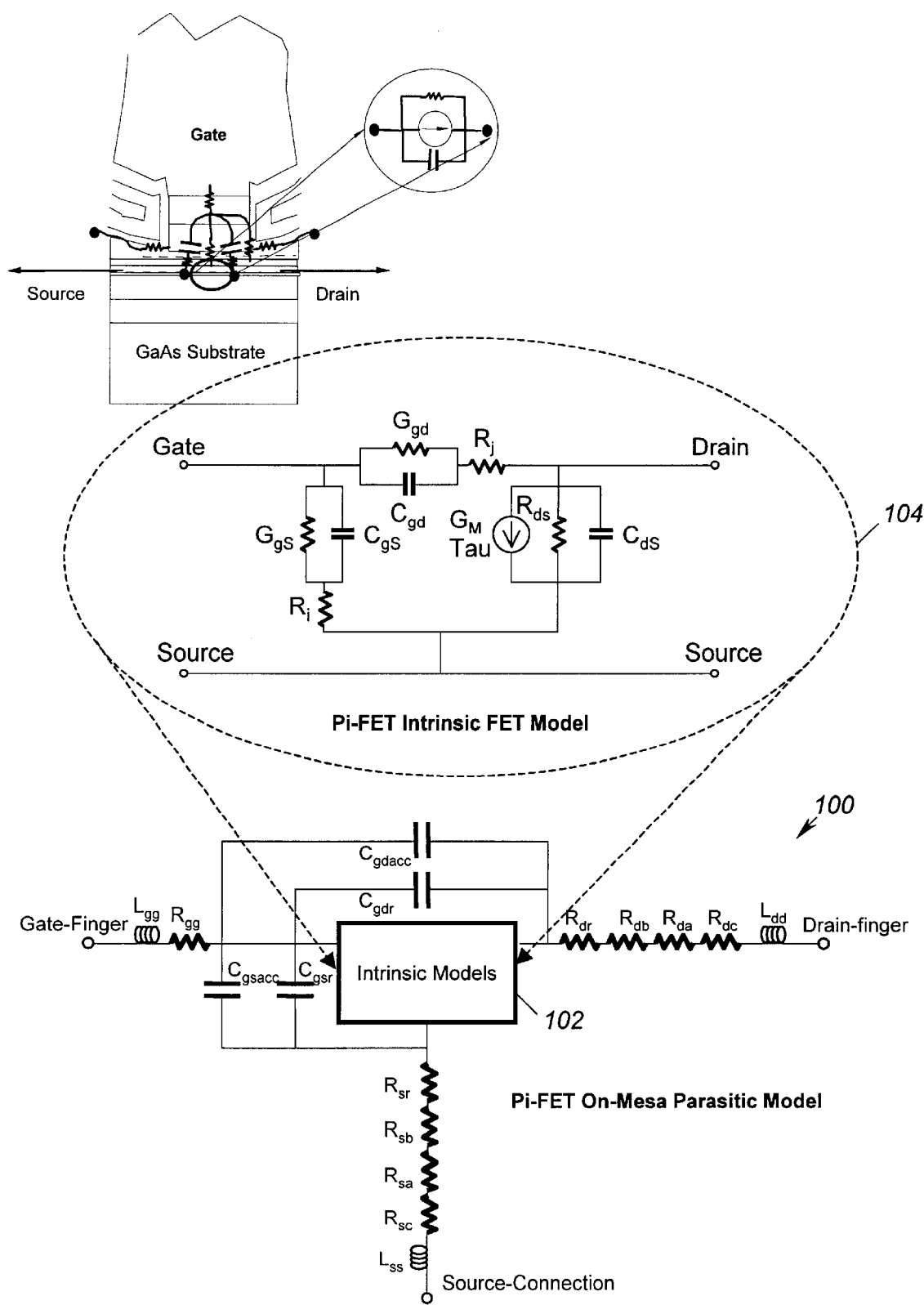
FIG. 32 is a single finger unit device cell intrinsic model in accordance with the present invention.
Figure 33:
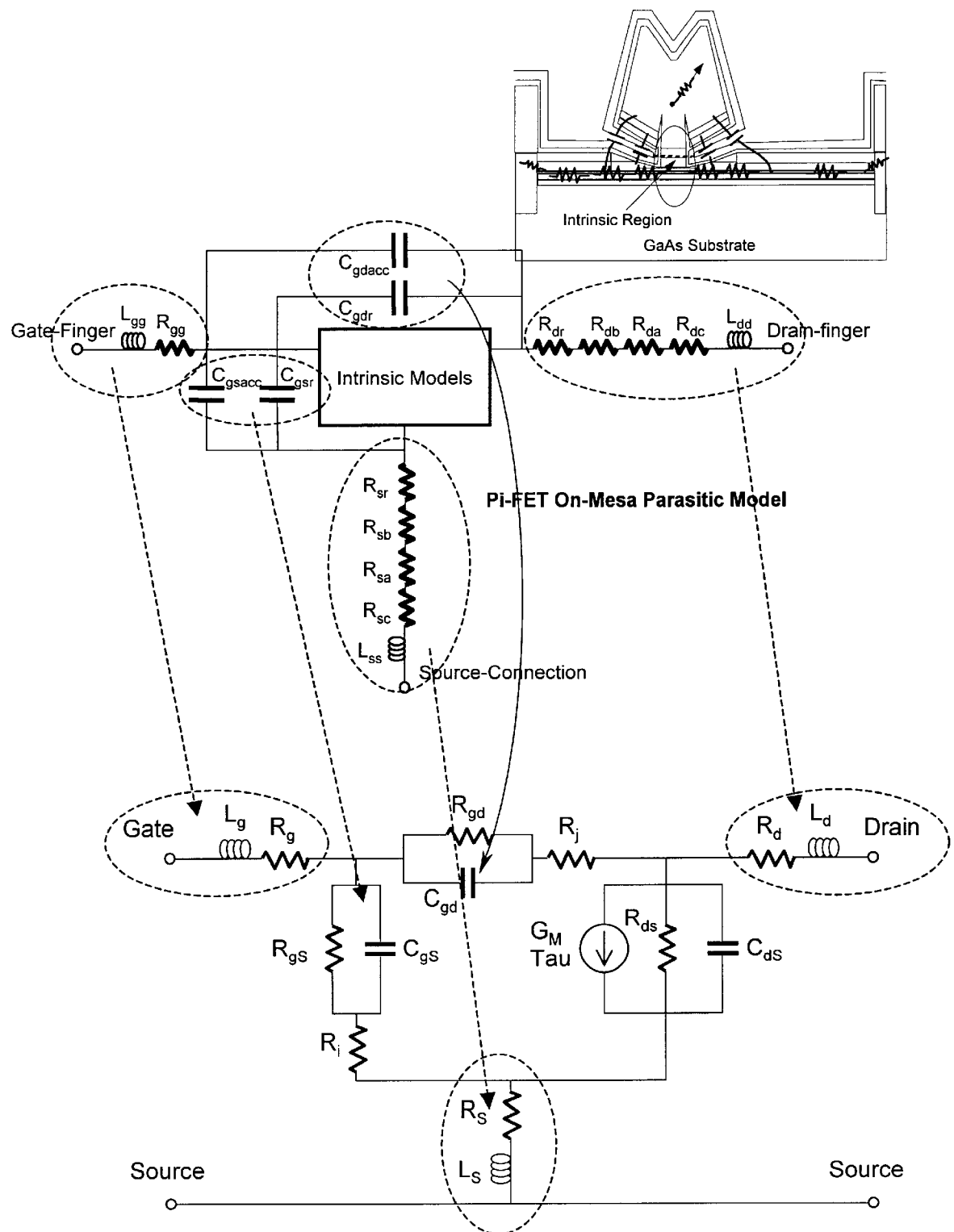
FIG. 33 is similar to FIG. 32 and illustrates the first level of embedding in accordance with the present invention.
Figure 34:
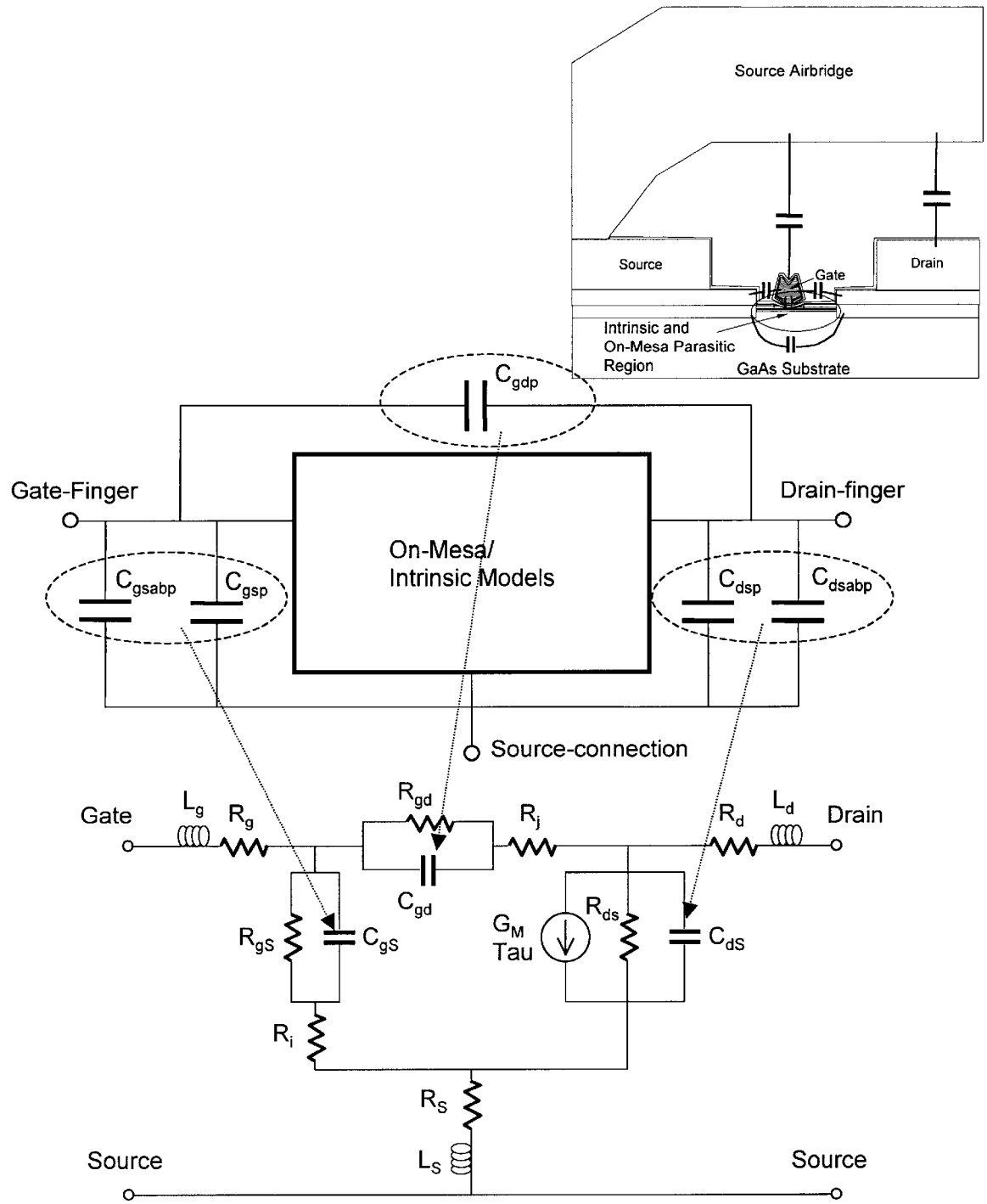
FIG. 34 is similar to FIG. 33 and illustrates the second level of embedding in accordance with the present invention.
Figure 35:
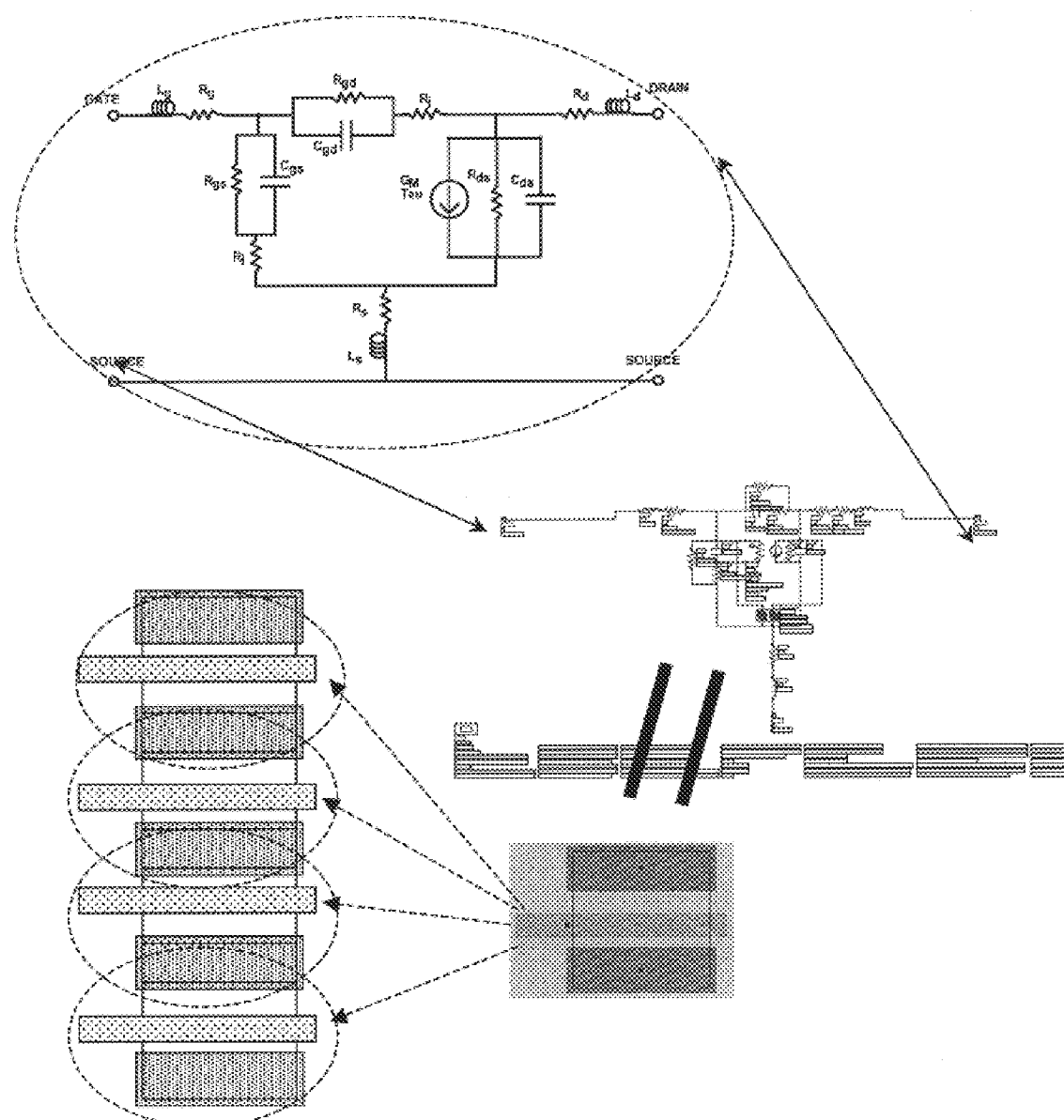
FIG. 35 is an equivalent circuit model of the π-FET illustrated in FIG. 31A in accordance with the present invention.
Figure 36:
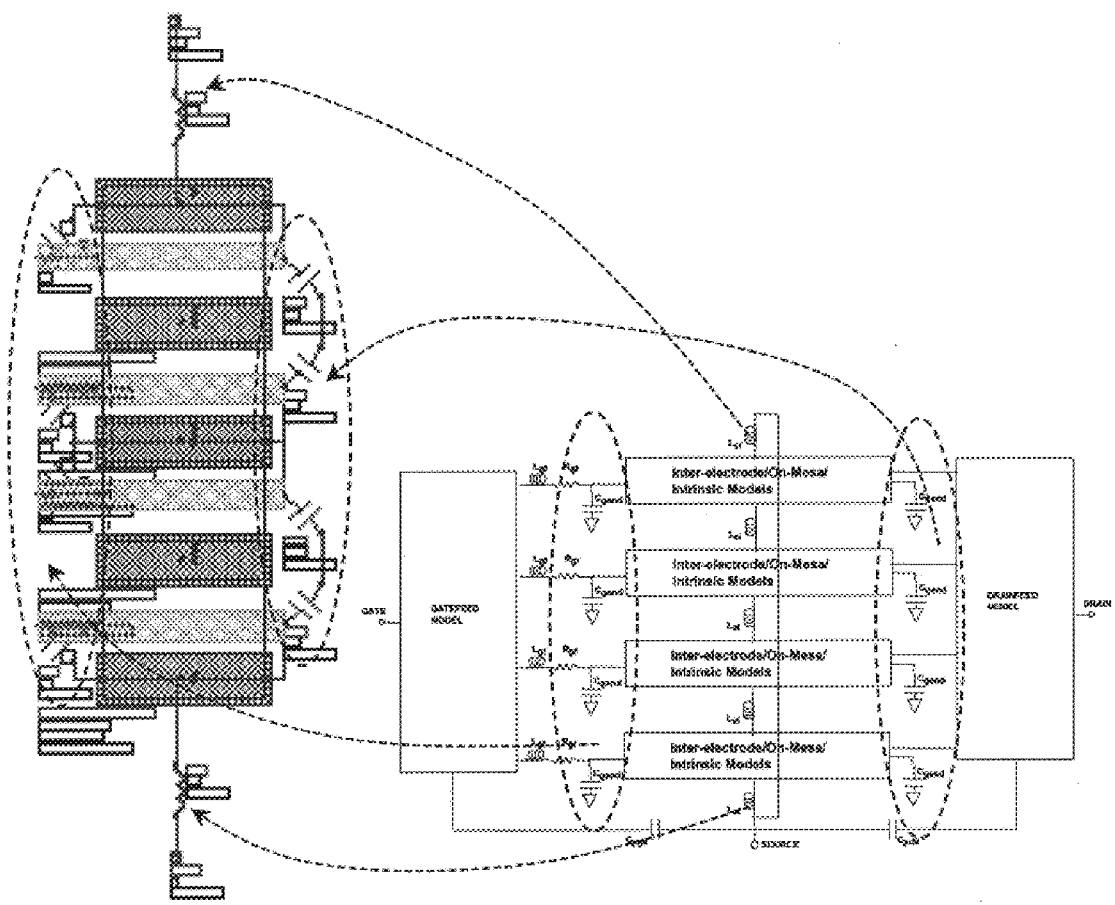
FIG. 36 is similar to FIG. 34 and illustrates the third level of embedding in accordance with the present invention.
Figure 37:
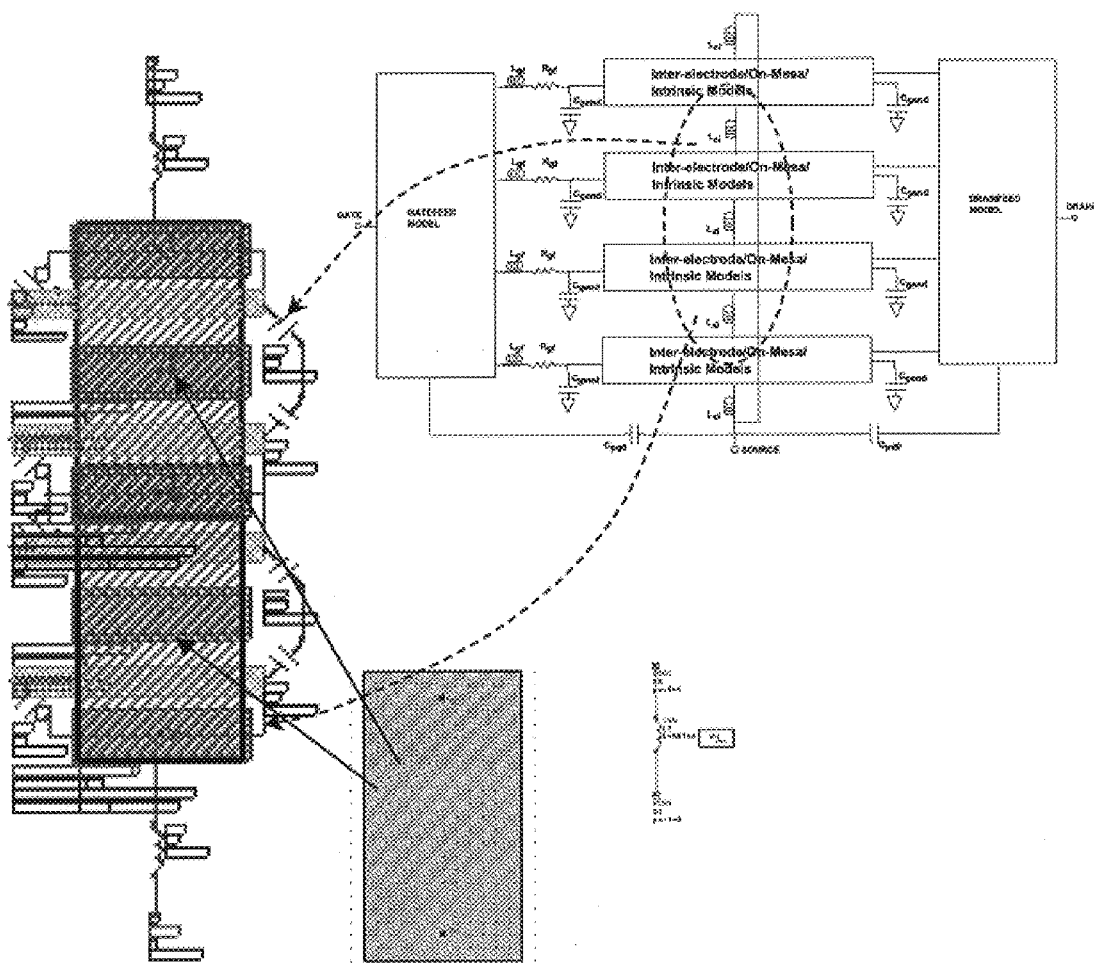
FIG. 37 is similar to FIG. 34 and illustrates the fourth level of embedding in accordance with the present invention.
Figure 38:
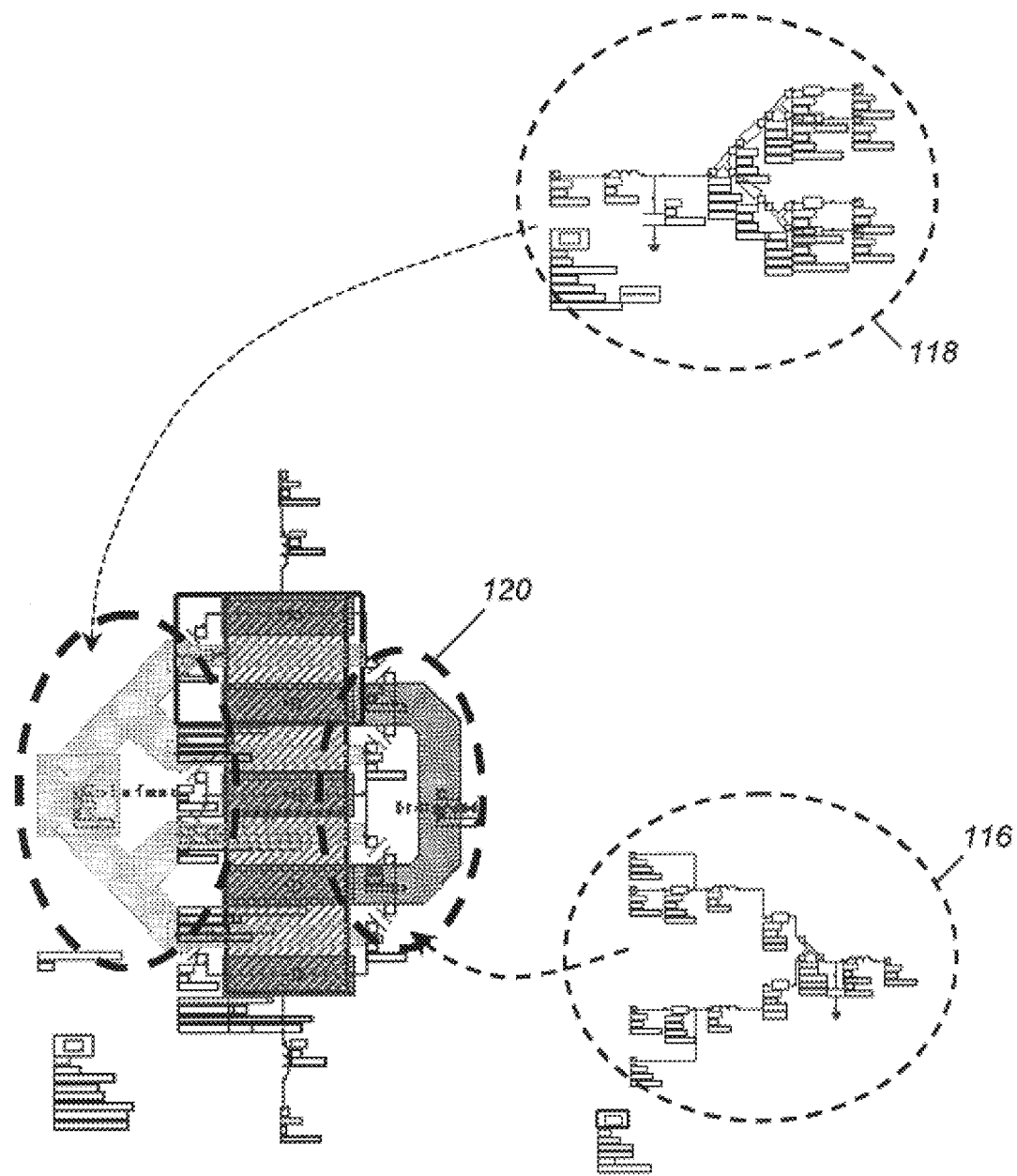
FIG. 38 is similar to FIG. 34 and illustrates the fifth level of embedding in accordance with the present invention.
Figure 39A:
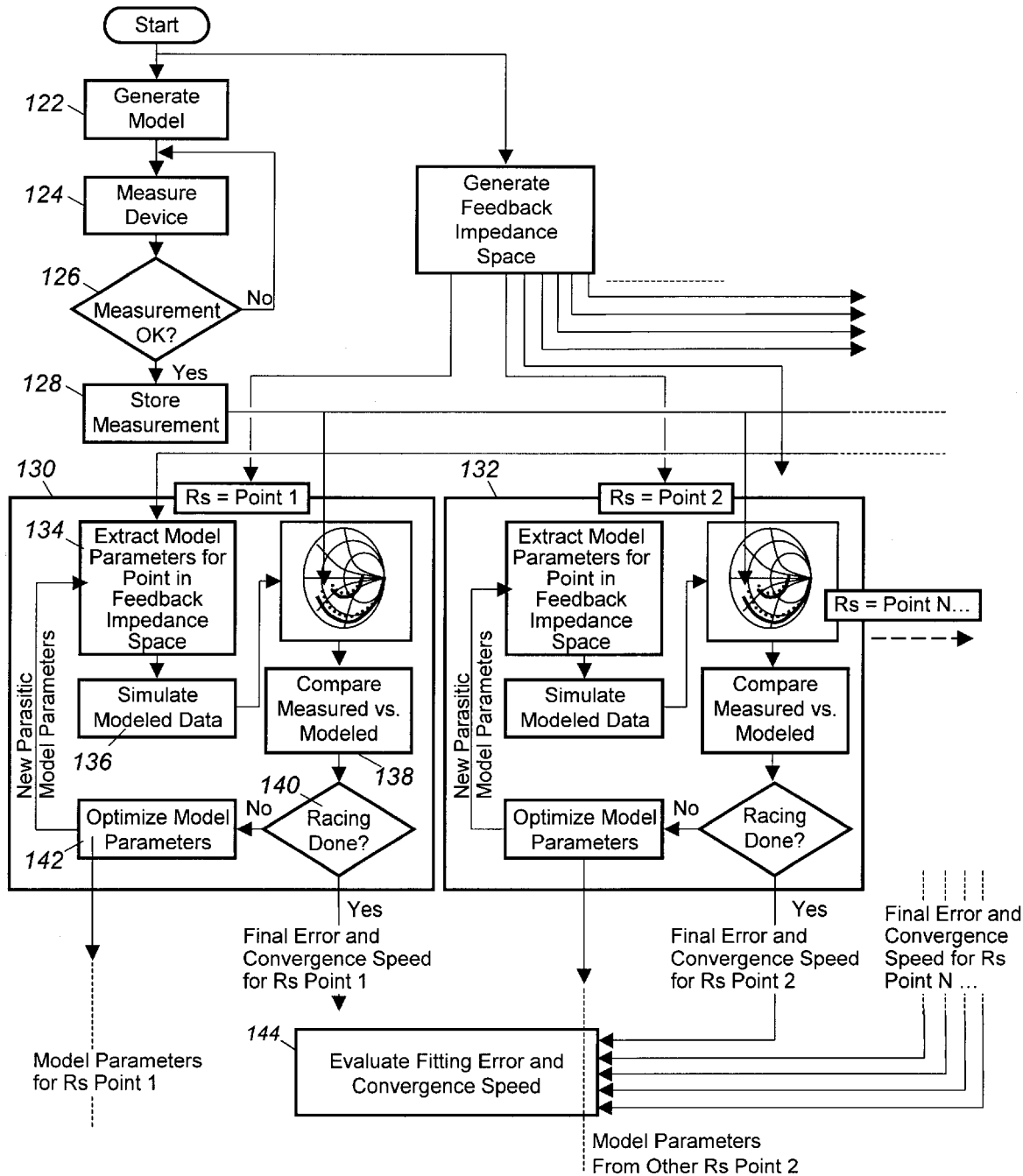
FIGS. 39A and 39B is a flow chart of a parameter extraction modeling algorithm that forms a part of the present invention.
Figure 39B:
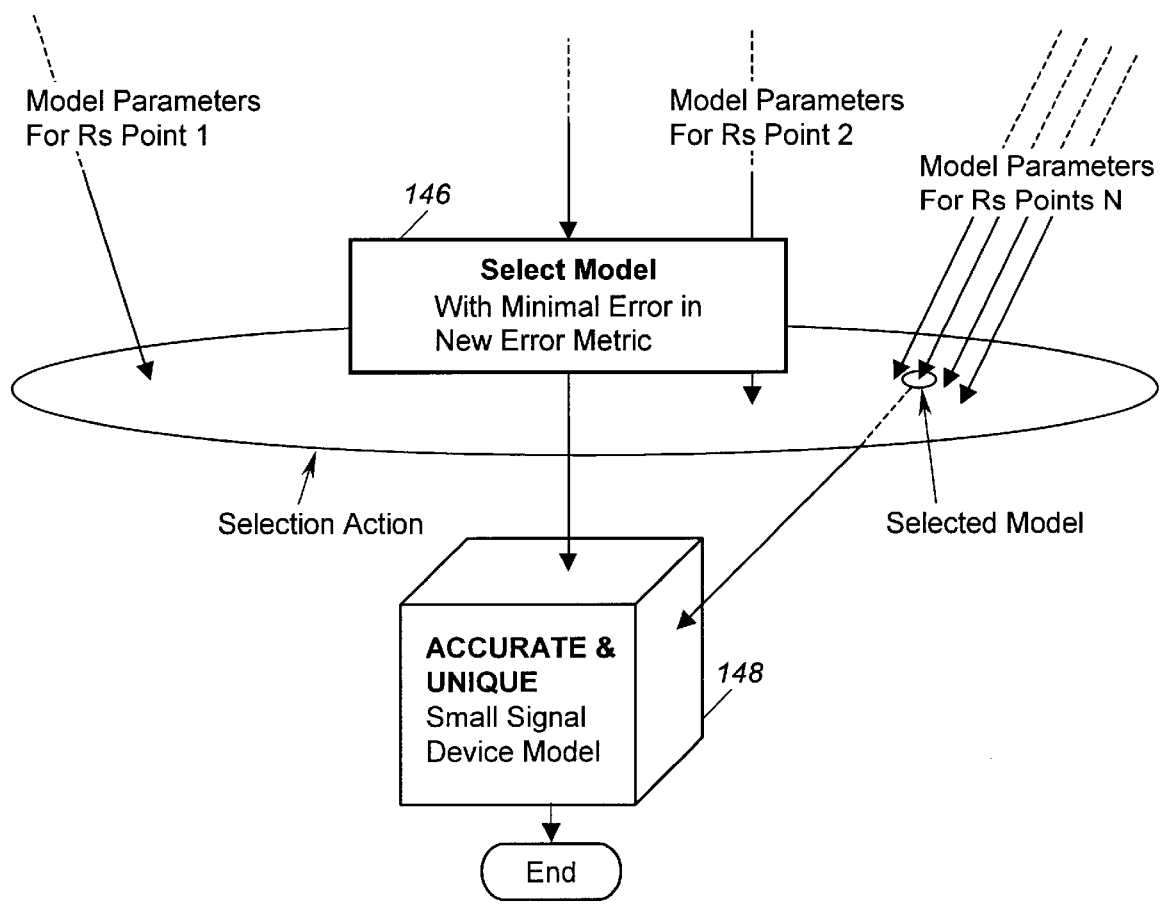
Figure 40:
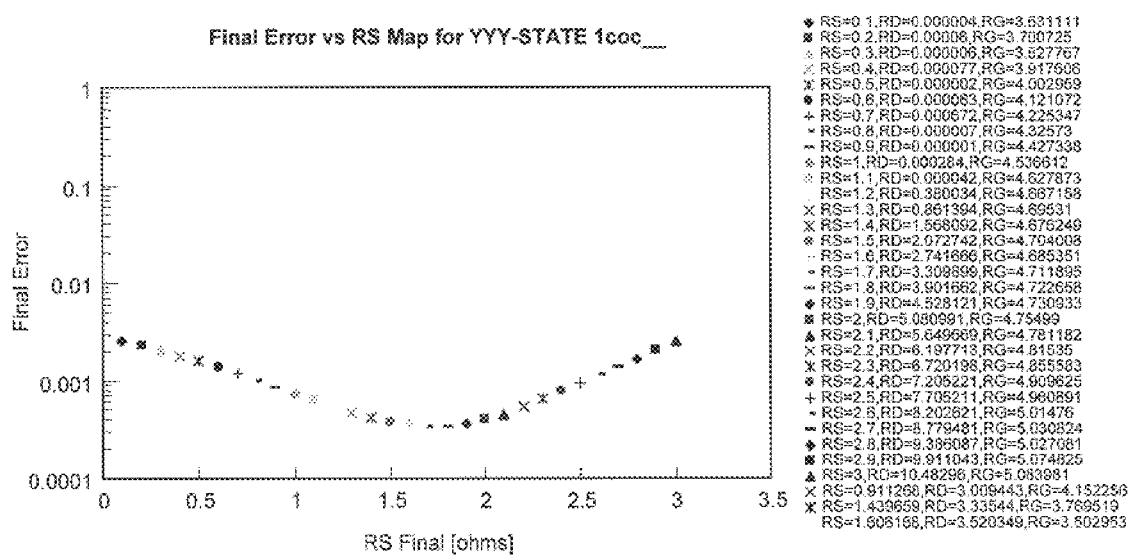
FIGS. 40 and 41 are graphical illustrations of an error metric in accordance with the present invention.

Initially, the four finger Pi-FET illustrated in FIG. 31A, is modeled as a single finger unit device cell 100 with an intrinsic model 102, as shown in FIGS. 32 and 33. In particular, the Pi-FET intrinsic FET model 104 is substituted for the block 102 defining a first level of embedding. As shown in FIG. 33, the parameter values for the Pi-FET intrinsic model are added together with the parameter values for the single fingered unit device cell intrinsic model. The intrinsic device model 104 may be developed by S-parameter microscopy as discussed above. Next, as illustrated in FIG. 34, the interconnect layout parasitic elements are added to the equivalent model by simply adding the model terms to the value of the appropriate circuit element to form a single unit device cell defining a second level of embedding. Once the single unit device cell is formulated, this device is used to construct models for multi-fingered devices. In this case, a Pi-FET with four gate fingers is modeled as four single finger device unit cells as shown in FIG. 35. Subsequently, the off-mesa layout parasitic elements are connected to the multi-fingered layout, defining a third level of embedding as illustrated in FIG. 36. These off-mesa layout parasitic elements, generally identified with the reference numerals 108 and 110, are implemented as new circuit elements connected at key outer nodes of the equivalent circuit structure. Subsequently, a fourth level of embedding is implemented as generally illustrated in FIG. 40. In particular, an inductor model is connected to the sources of each of the various unit device cells to represent the metallic bridge interconnection, as generally shown in FIG. 37. Lastly, as illustrated in FIG. 39, a fifth level of embedding is implemented in which the feed electrodes model 114 and 116 are modeled as lumped linear elements (i.e. capacitors inductors) as well as the distributive elements (i.e. microstrip lines and junctions) to form the gate feed and drain connections illustrated in FIG. 38. As shown, the distributive elements are distributed models for microstrip elements as implemented in LIBRA 6.1.

EXTRACTION METHOD FOR UNIQUE DETERMINATION OF FET EQUIVALENT CIRCUIT MODELS

The method for determining FET equivalent circuit parameters as discussed above is illustrated in FIGS. 39–44. This method is based on an equivalent circuit model, such as the common source FET equivalent circuit model illustrated in FIG. 8. Referring to FIG. 39A, a model is initially generated in step 122. The model illustrated in FIG. 8 is used as a small signal model for the FET. In accordance with an important aspect of the algorithm, the equivalent circuit parameters are based upon measured FET S-parameters. Measurement of S-parameters of semiconductor devices is well known in the art. FIG. 42A is a Smith chart illustrating exemplary measured S-parameters S11, S12 and S22 for frequencies between 0.05 to 40 GHz. FIG. 42B represents a magnitude angle chart for the measured S-parameter S21 from frequencies from 0.05 to 40 GHz. After the S-parameters are measured, as set forth in step 124 (FIG. 39A), it is ascertained whether the measurements are suitable in step 126. This is either done by manually inspecting the test result for anomalies, or by algorithms to validate the test set. If the measurements are suitable, the S-parameter measurements are stored in step 128.

A space of trial starting impedance point values, for example, as illustrated in Table 4 is chosen. Then, a direct model extraction algorithm, known as the Minasian algorithm, is used to generate preliminary values for the equivalent circuit model parameters, for each value of starting feedback impedance. Such extraction algorithms are well known in the art, for example, as disclosed "Broadband Determination of the FET Small Equivalent Small Signal Circuit" by M. Berroth, et al., *IEEE-MTT,* Vol. 38, No. 7, July 1980. Model parameter values are determined for each of the starting impedance point values illustrated in Table 4. In particular, referring to FIG. 39A, each impedance point in Table 4 is processed by the blocks 130, 132, etc. to develop model parameter values for each of the impedance point in order to develop an error metric, which, in turn, is used to develop a unique small signal device model, as will be discussed below. The processing in each of the blocks 130, 132 is similar. Thus, only a single block 130 will be discussed for an exemplary impedance point illustrated in Table 4. In this example, the impedance point 17 which correlates to a source resistance $R_s$ ohm of 1.7 Ω and a source inductance $L_s$ of 0.0045 pH is used.

TABLE 4

Trial Starting Feedback, Impedance Space Point Values

| Impedance Point | Resistance (Rs) | Inductance (Ls) |
|---|---|---|
| 1 | 0.1 Ω | 0.0045 pH |
| 2 | 0.2 Ω | 0.0045 pH |
| 3 | 0.3 Ω | 0.0045 pH |
| 4 | 0.4 Ω | 0.0045 pH |
| 5 | 0.5 Ω | 0.0045 pH |
| 6 | 0.6 Ω | 0.0045 pH |
| 7 | 0.7 Ω | 0.0045 pH |
| 8 | 0.8 Ω | 0.0045 pH |
| 9 | 0.9 Ω | 0.0045 pH |
| 10 | 1.0 Ω | 0.0045 pH |
| 11 | 1.1 Ω | 0.0045 pH |
| 12 | 1.2 Ω | 0.0045 pH |
| 13 | 1.3 Ω | 0.0045 pH |
| 14 | 1.4 Ω | 0.0045 pH |
| 15 | 1.5 Ω | 0.0045 pH |
| 16 | 1.6 Ω | 0.0045 pH |
| 17 | 1.7 Ω | 0.0045 pH |
| 18 | 1.8 Ω | 0.0045 pH |
| 19 | 1.9 Ω | 0.0045 pH |
| 20 | 2.0 Ω | 0.0045 pH |
| 21 | 2.1 Ω | 0.0045 pH |
| 22 | 2.2 Ω | 0.0045 pH |
| 23 | 2.3 Ω | 0.0045 pH |
| 24 | 2.4 Ω | 0.0045 pH |
| 25 | 2.5 Ω | 0.0045 pH |
| 26 | 2.6 Ω | 0.0045 pH |
| 27 | 2.7 Ω | 0.0045 pH |
| 28 | 2.8 Ω | 0.0045 pH |
| 29 | 2.9 Ω | 0.0045 pH |
| 30 | 3.0 Ω | 0.0045 pH |

Figure 43A:
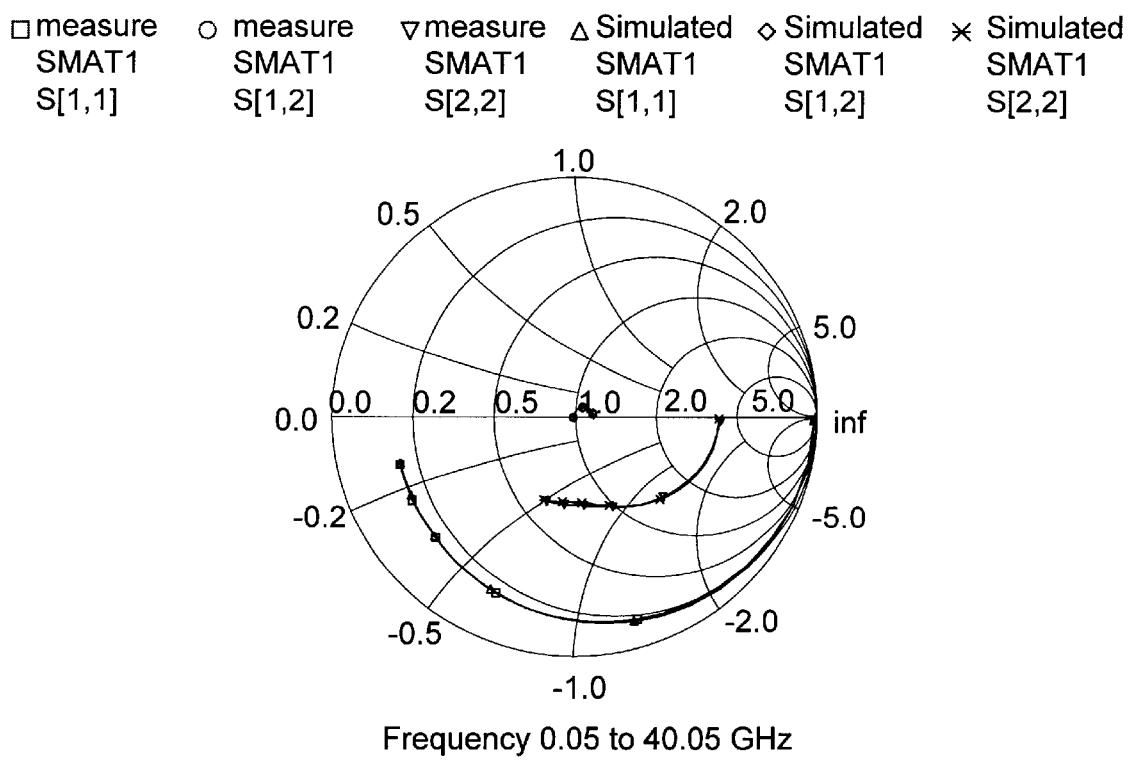
FIG. 43A is a Smith chart illustrating the measured versus simulated S-parameters S11, S12 and S22 for frequencies 0.05 to 40 GHz for the first extraction optimization cycle.
Figure 43B:
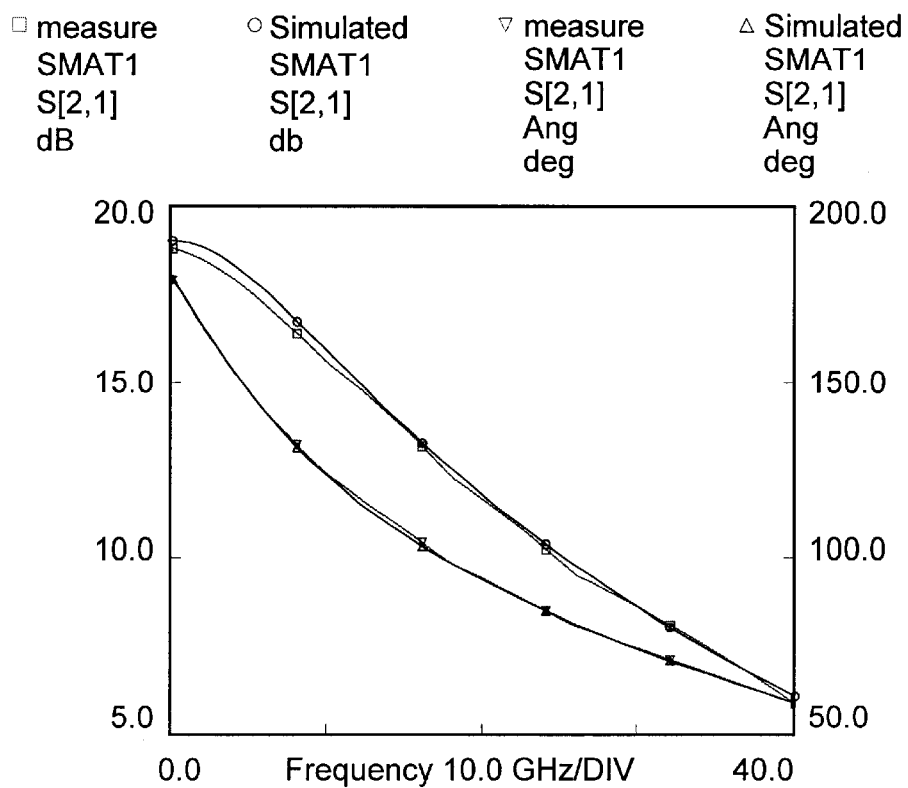
FIG. 43B is a graphical illustration of magnitude as a function of angle for the measure and first optimized model S-21 parameter for frequencies 0.05 to 40 GHz for the first optimization cycle.

For the selected value, $R_s$=1.7 ohms, initial intrinsic equivalent circuit parameters and initial parasitic equivalent circuit parameter are determined, for example, by the Minasian algorithm discussed above and illustrated in Tables 5 and 6 as set forth in steps 134 and 136. In step 138 the simulated circuit parameters are compared with the measured S-parameters, for example, as illustrated in FIGS. 43A and 43B. Each of the processing blocks 130 and 132 etc. goes through six complete cycles. As such, the system determines in step 140 whether the six cycles are complete.

TABLE 5

Initial "Intrinsic" Equivalent Circuit Parameters

| Intrinsic Equivalent Circuit Parameter | Initial Solution |
| --- | --- |
| Cgs | 0.23595 pF |
| Rgs | 91826 Ω |
| Cgd | 0.0177 pF |
| Rgd | 100000 Ω |
| Cds | 0.04045 pF |
| Rds | 142.66 Ω |
| Gm | 142.1025 mS |
| Tau | 0.1 pS |

TABLE 6

Initial "Parasitic" Equivalent Circuit Parameters

| Intrinsic Equivalent Circuit Parameter | Initial Solution |
| --- | --- |
| Rg | 3.0 Ω |
| Lg | 0.014 nH |
| Rs | 1.7 Ω |
| Ls | 0.0045 nH |
| Rd | 2.5 Ω |
| Ld | 0.024 nH |

Each cycle of the processing block 130 consists of a direct extraction followed by an optimization with a fixed number of optimization iterations, for example 60. By fixing the number of extraction-optimization cycles along with the number of optimization iterations, a fixed "distance" or calculation time which the model solution must be derived is defined. As such, the algorithm implements a convergence speed requirement of the global error metric by setting up an environment where each trial model solution competes against each other by achieving the lowest fitting error over a fixed calculation time thus causing a "race" criteria to be implemented where "convergence speed" is implicitly calculated for each processing block 130, 132 etc.

After the system determines whether the racing is done in step 140, the system proceeds to block 142 and optimizes model parameters. Various commercial software programs are available, for example, the commercially available, LIBRA 3.5 software as manufactured by HP-eesof may be used both for circuit simulation as well as optimizing functions. The optimization is performed in accordance with the restrictions set forth in Table 7 with the addition of fixing the feedback resistance $R_s$ to a fixed value.

TABLE 7

Environment Used for Competitive Solution Strategy, as Implemented in this Example

| Implementation Parameter | |
| --- | --- |
| Circuit Simulator and Optimizer | Libra 3.5 |
| Optimization Algorithm | Gradient |
| Optimization Error Metric | Mag and angle of S11, S21, S12, and S22 from 4 to 40 GHz |
| Number of Iterations | 60 |
| Number of Extraction/Optimization Cycles | 6 |

By fixing the value for $R_s$ this segment of the algorithm confined to creating a trial model solution for only the trial feedback impendence point with which it started. Table 8 illustrates the optimized intrinsic equivalent parameter values using commercially available software, such as LIBRA 3.5. These values along with the optimized parasitic values, illustrated in Table 9, form the first optimized model solution for the first extraction-optimization cycle (i.e. one of six). The optimized model parameters are then fed back to the function block 134 and 136 (FIG. 39A) and used for a new initial model solution. These values are compared with the measured S-parameter value as illustrated in FIGS. 43A and 43B. The system repeats this cycle for six cycles in a similar fashion as discussed above. After the six extraction-optimization cycle, the final trial model solution for the trial impendence point 17 is complete along with its final fitting error to the measured data to form the new error metric 144. In accordance with an important aspect, the extraction-optimization algorithm makes the final optimization fitting error for each point implicitly carry information about both the measured to model fitting error and the speed of convergence. It does so by the fixed optimization time constraint which sets up a competitive race between the various trial model solutions.

TABLE 8

Optimized "Intrinsic" Equivalent Circuit Parameters

| Intrinsic Equivalent Circuit Parameter | Initial Solution |
| --- | --- |
| Cgs | 0.227785 pF |
| Rgs | 65247 Ω |
| Cgd | 0.017016 pF |
| Rgd | 130820 Ω |
| Cds | 0.047521 pF |
| Rds | 160.18 Ω |
| Gm | 135.74 mS |
| Tau | 0.446 pS |

TABLE 9

Optimized "Parasitic" Equivalent Circuit Parameters

| Intrinsic Equivalent Circuit Parameter | Initial Solution |
| --- | --- |
| Rg | 4.715 Ω |
| Lg | 0.02903 nH |
| Rs* | 1.7 Ω |
| Ls | 0.002102 nH |
| Rd | 3.2893 Ω |
| Ld | 0.0317 nH |

Figure 41:
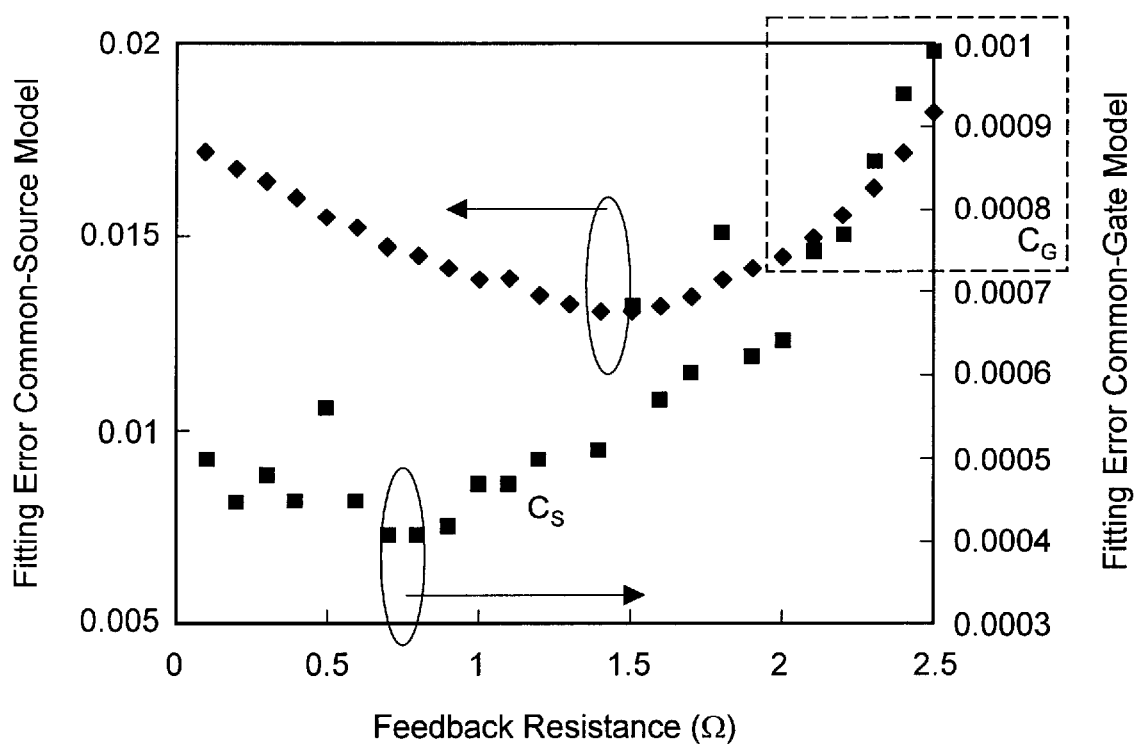
Figure 42A:
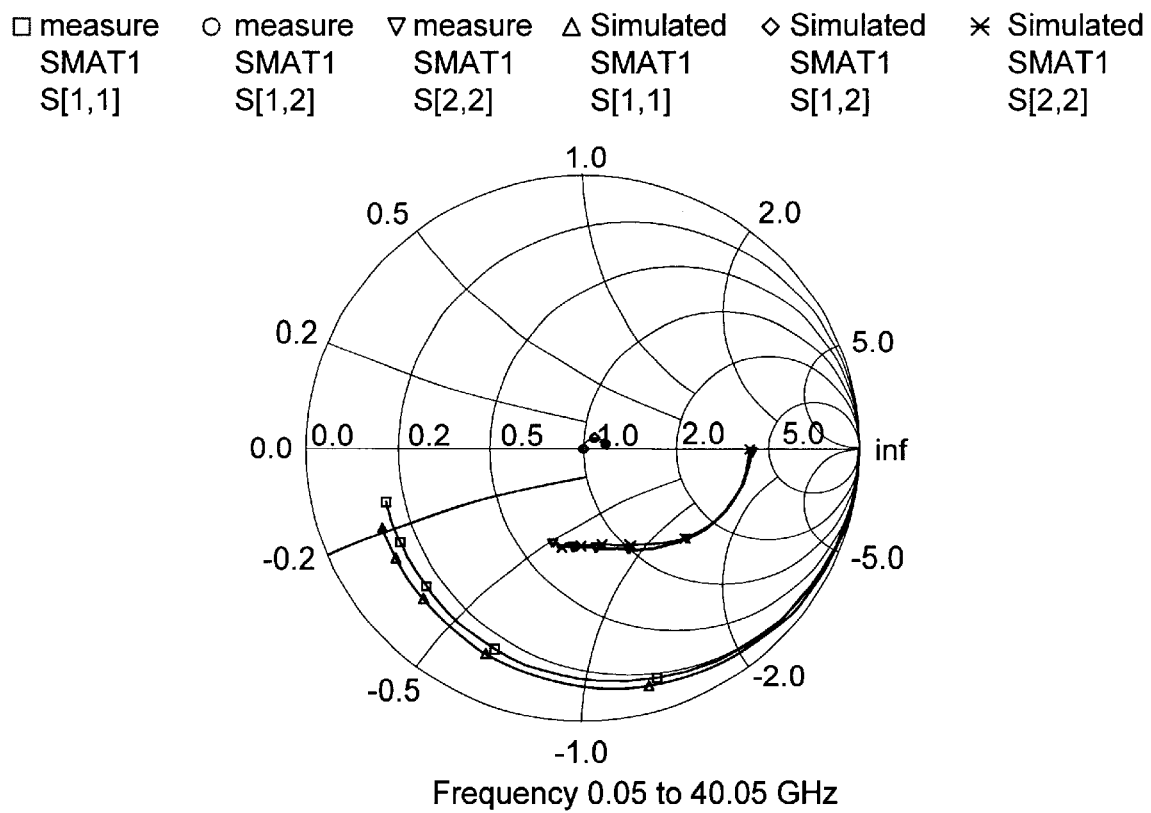
FIG. 42A is a Smith chart illustrating the measured versus the initial model solutions for the S11, S12 and S22 S-parameters from frequencies from 0.05 to 40.0 GHz.
Figure 42B:
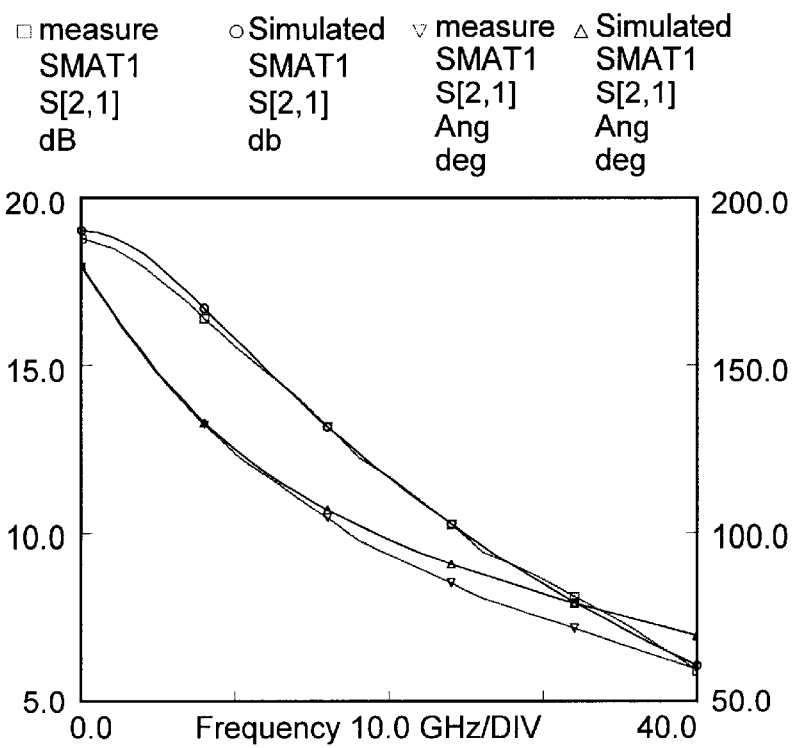
FIG. 42B is a graphical illustration of angle versus magnitude for the initially modeled S-parameter S21 from frequencies of 00.5 to 40 GHz.

The implementation of the extraction optimization cycles makes the best and fastest solving solution appear as a global minima for the final fitting error in step 146 of all of the trial impedance points as generally shown in FIGS. 40 and 41. More specifically, referring to FIG. 40 the global minima solution using the new error metric is found around $R_s$=1.7 ohms. Tables 10 and 11 list the final model equivalent circuit parameters for this global solution, including the intrinsic and parasitic parameter as set forth in step 148 (FIG. 39B).

TABLE 10

Global Solution for "Instrinsic" Equivalent Circuit Parameters

| Intrinsic Equivalent Circuit Parameter | Initial Solution |
|---|---|
| Cgs | 0.227745 pF |
| Rgs | 64242 Ω |
| Cgd | 0.017019 pF |
| Rgd | 133450 Ω |
| Cds | 0.047544 pF |
| Rds | 160.1791 Ω |
| Gm | 135.7568 mS |
| Tau | 0.443867 pS |

TABLE 11

Global Solution "Parasitic" Equivalent Circuit Parameters

| Extrinsic Equivalent Circuit Parameter | Initial Solution |
|---|---|
| Rg | 4.711895 Ω |
| Lg | 0.029314 nH |
| Rs | 1.7 Ω |
| Ls | 0.002104 nH |
| Rd | 3.309899 Ω |
| Ld | 0.031671 nH |

Figure 44A:
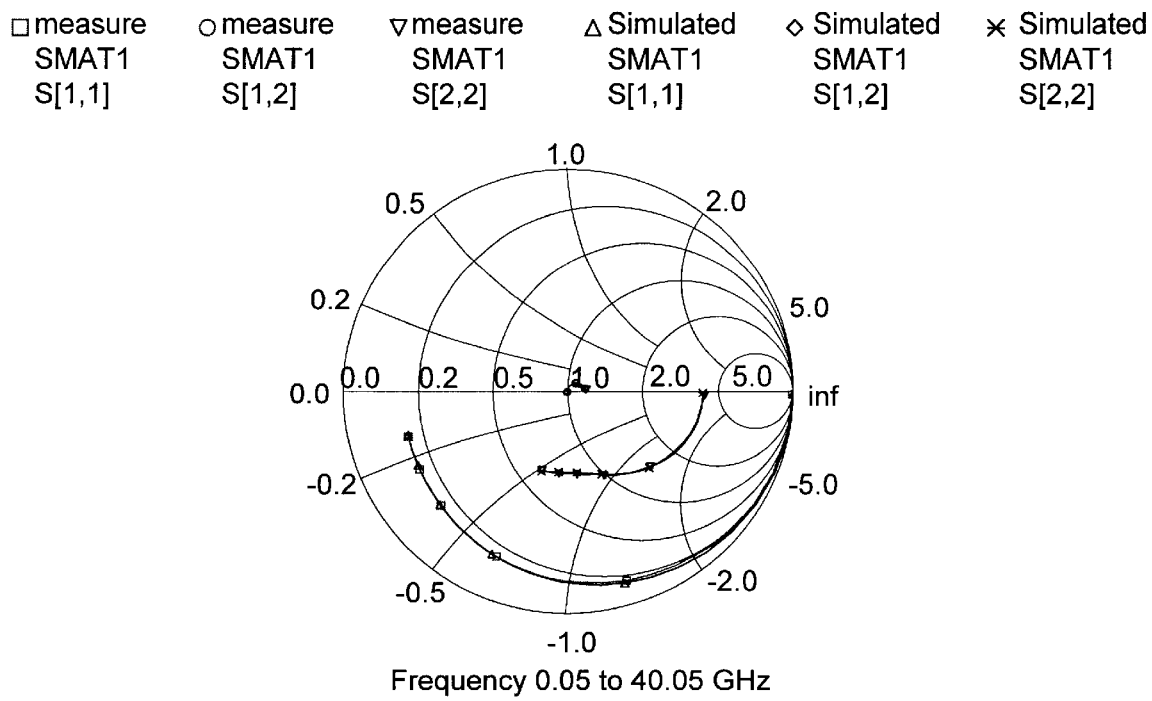
FIG. 44A is a Smith chart illustrating the measure as a function of the final model solution for S-parameters S11, S12 and S22 for frequencies 0.05 to 40 GHz for the final solution.
Figure 44B:
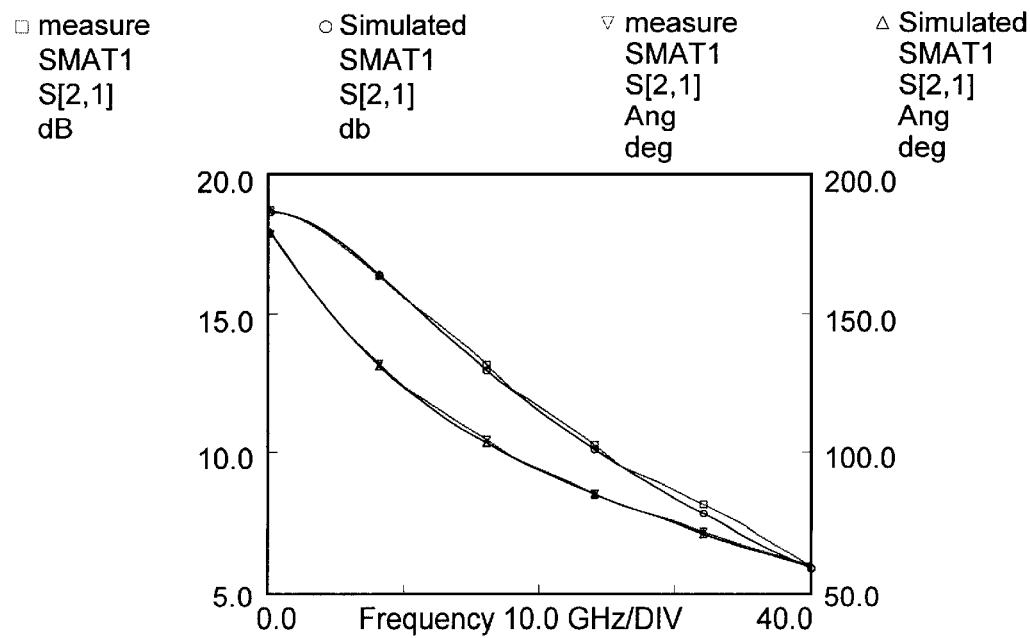

In order to test the accuracy of the solution, the final model for solutions are compared with the measured S-parameter values as shown in FIGS. 44A and 44B. As shown, there is good correlation between the simulated model values and the measured S-parameters values thus verifying that the simulated model values represent a relatively accurate and unique small signal device model.

Obviously, many modifications and variations of the present invention are possible in light of the above teachings. Thus, it is to be understood that, within the scope of the appended claims, the invention may be practiced otherwise than as specifically described above.

What is claimed and desired to be covered by a Letters Patent is as follows:

I claim:

1. A method for modeling a multi-fingered semiconductor device, the method comprising the steps of:

(a) modeling a multi-fingered device as a combination of single finger device cells; and (b) modeling each single finger device cell by representing each single finger device cell by a hierarchy of a plurality of models and representing each single device cell as a boundary parasitic model, wherein the boundary parasitic model is modeled by modeling the off-mesa gate finger resistance.

2. A method for modeling a multi-fingered semiconductor device, the method comprising the steps of:

(a) modeling a multi-fingered device as a combination of single finger device cells; and (b) modeling each single finger device cell by a hierocracy of a plurality of models and representing each single device cell as a boundary parasitic model, wherein step (b) includes the step of modeling the on-mesa parasitics.

3. The method as recited in claim 2, wherein said step of modeling the on-mesa parasitics includes the step of modeling the parasitics around the active FET region along each gate finger including one or more of the following capacitance fringing parasitics: gate to source side recess; gate-drain side recess, gate-source access charge/doped cap; and gate-drain access charge-doped cap capacitance fringing parasitics.

4. The method as recited in claim 3, wherein said step of modeling the on-mesa parasitics further includes the step of modeling the resistive parasitics around the active FET region including one or more of the following resistence; gate metallization and ohmic contact resistive parasitics.

5. A method for modeling a multi-fingered semiconductor device, the method comprising the steps of:

(a) modeling a multi-fingered device as a combination of single-fingered device cells; and (b) modeling each single fingered device cell by a hierarchy of a plurality of models and representing each single device cell as a boundary parasitic model, wherein step (b) including the step of modeling an intrinsic model and by determining the DC and current voltage response analytically by way of the magnitude and location of the intrinsic charge.

6. The method as recited in claim 5, wherein the step of modeling the intrinsic model includes the step of determining the small signal model for the device.

7. The method as recited in claim 6, wherein the step of determining the small signal model includes the step of determining one or more of the following terms: IR, IJ, RDS, RGS, RGD, GM, TAU, CGS, CDS and CGD.

* * * * *